(12) United States Patent
Muhammad et al.

(10) Patent No.: US 7,079,826 B2
(45) Date of Patent: Jul. 18, 2006

(54) DIGITALLY CONTROLLED ANALOG RF FILTERING IN SUBSAMPLING COMMUNICATION RECEIVER ARCHITECTURE

(75) Inventors: Khurram Muhammad, Dallas, TX (US); Dirk L. Leipold, Plano, TX (US); Feng Chen, Plano, TX (US); Kenneth J. Maggio, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 167 days.

(21) Appl. No.: 10/099,831

(22) Filed: Mar. 15, 2002

(65) Prior Publication Data

US 2003/0050027 A1 Mar. 13, 2003

Related U.S. Application Data

(60) Provisional application No. 60/343,673, filed on Dec. 29, 2001, provisional application No. 60/286,421, filed on Apr. 25, 2001, provisional application No. 60/286,564, filed on Apr. 25, 2001, provisional application No. 60/286,736, filed on Apr. 25, 2001, provisional application No. 60/286,787, filed on Apr. 25, 2001, provisional application No. 60/286,788, filed on Apr. 25, 2001, provisional application No. 60/276,716, filed on Mar. 16, 2001, provisional application No. 60/276,727, filed on Mar. 16, 2001.

(51) Int. Cl.
*H04B 1/06* (2006.01)

(52) U.S. Cl. ............... 455/262; 455/257; 455/118; 455/137

(58) Field of Classification Search ............ 455/112, 455/118, 131, 137, 257
See application file for complete search history.

(56) References Cited

U.S. PATENT DOCUMENTS

| 5,162,723 | A | * | 11/1992 | Marzalek et al. | ......... 324/76.19 |
| 5,697,078 | A | * | 12/1997 | Peterson et al. | ......... 455/190.1 |
| 6,005,506 | A | * | 12/1999 | Bazarjani et al. | ............ 341/143 |
| 6,294,896 | B1 | * | 9/2001 | Champlin | ................... 320/134 |
| 6,678,709 | B1 | * | 1/2004 | Gandhi et al. | ............... 708/319 |

OTHER PUBLICATIONS

Copending U.S. Appl. No. 09/828,338, filed Apr. 6, 2001.
Copending U.S. Appl. No. 09/850,435, filed May 7, 2001.

* cited by examiner

*Primary Examiner*—Temica Beamer
(74) *Attorney, Agent, or Firm*—Ronald O. Neerings; Wade James Brady, III; Frederick J. Telecky, Jr.

(57) ABSTRACT

A first periodic voltage waveform (20) is downconverted into a second periodic voltage waveform (35, 36). A plurality of temporally distinct samples (SA1, SA2, ... ) respectively indicative of areas under corresponding half-cycles of the first voltage waveform are obtained. The samples are combined to produce the second voltage waveform, and are also manipulated to implement a filtering operation such that the second voltage waveform represents a downconverted, filtered version of the first voltage waveform.

38 Claims, 17 Drawing Sheets

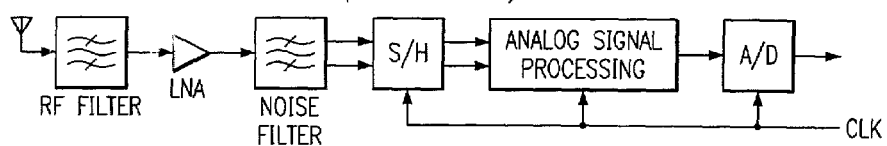
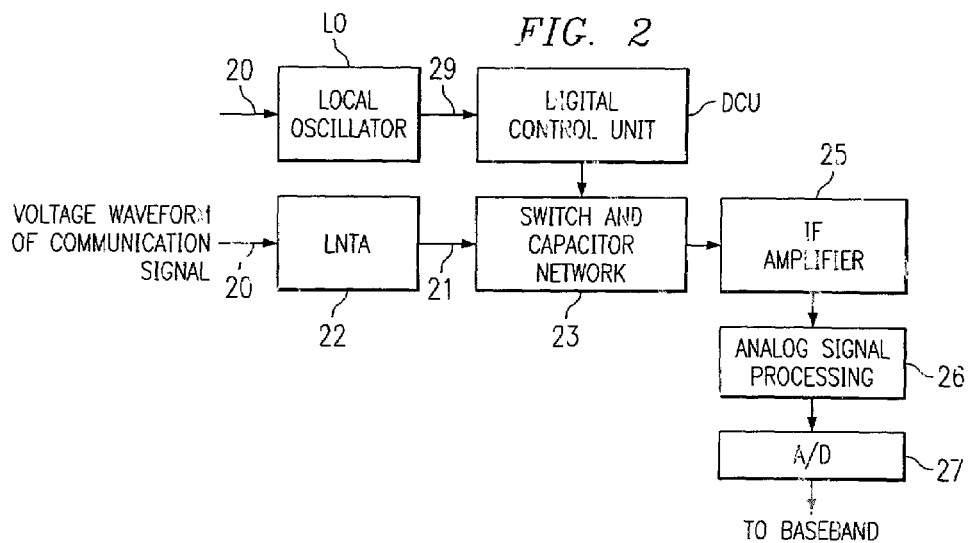
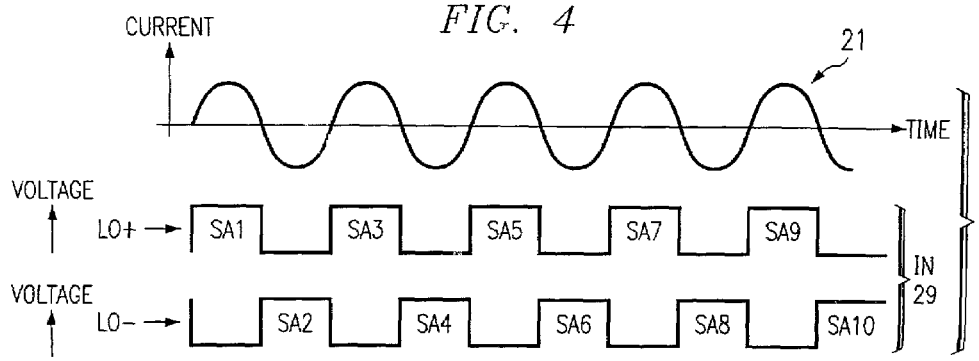

FIG. 5

| SAMPLE | SWITCHES CLOSED |
|---|---|
| SA1 | S1 AND R8 |
| SA2 | S5 AND R1 |
| SA3 | S2 AND R5 |
| SA4 | S6 AND R2 |
| SA5 | S3 AND R6 |
| SA6 | S7 AND R3 |
| SA7 | S4 AND R7 |
| SA8 | S8 AND R4 |
| SA9 | S1 AND R8 |
| SA10 | S5 AND R1 |
| SA11 | S2 AND R5 |
| ⋮ | ⋮ |

FIG. 5A

| SAMPLE | SWITCHES CLOSED FOR SAMPLING | SWITCHES CLOSED FOR READ OUT |
|---|---|---|
| SA1 | S1 | R3,R4,R7,R8 |
| SA2 | S5 | –do– |
| SA3 | S2 | –do– |
| SA4 | S6 | –do– |
| SA5 | S3 | R1,R2,R5,R6 |
| SA6 | S7 | –do– |
| SA7 | S4 | –do– |
| SA8 | S8 | –do– |
| SA9 | S1 | R3,R4,R7,R8 |
| SA10 | S5 | –do– |
| ⋮ | ⋮ | ⋮ |

| SAMPLE | SWITCHES CLOSED |
|---|---|
| SA1 | S1 AND R4 AND R8 |
| SA2 | S5 AND R8 |
| SA3 | S1 |
| SA4 | S5 AND R1 |
| SA5 | S2 AND R1 AND R5 |
| SA6 | S6 AND R5 |
| SA7 | S2 |
| SA8 | S6 AND R2 |
| SA9 | S3 AND R2 AND R6 |
| SA10 | S7 AND R6 |
| SA11 | S3 |
| SA12 | S7 AND R3 |
| SA13 | S4 AND R3 AND R7 |
| SA14 | S8 AND R7 |
| SA15 | S4 |
| SA16 | S8 AND R4 |
| SA17 | S1 AND R4 AND R8 |
| SA18 | S5 AND R8 |
| SA19 | S1 |
| SA20 | S5 AND R1 |
| SA21 | S2 AND R1 AND R5 |
| ⋮ | ⋮ |

| SAMPLE | SWITCHES CLOSED FOR SAMPLING | SWITCHES CLOSED FOR READ OUT |
|---|---|---|
| SA1 | S1 | R3,R4,R7,R8 |
| SA2 | S5 | –do– |
| SA3 | S1 | –do– |
| SA4 | S5 | –do– |
| SA5 | S2 | –do– |
| SA6 | S6 | –do– |
| SA7 | S2 | –do– |
| SA8 | S6 | –do– |
| SA9 | S3 | R1,R2,R5,R6 |
| SA10 | S7 | –do– |
| SA11 | S3 | –do– |
| SA12 | S7 | –do– |
| SA13 | S4 | –do– |
| SA14 | S8 | –do– |
| SA15 | S4 | –do– |
| SA16 | S8 | –do– |
| SA17 | S1 | R3,R4,R7,R8 |
| SA18 | S5 | –do– |
| SA19 | S1 | –do– |
| SA20 | S5 | –do– |
| ⋮ | ⋮ | ⋮ |

| SAMPLE | SWITCHES CLOSED |
|---|---|
| SA1 | S1,S2,R4 AND R7 |
| SA2 | S5,S6,R1 AND R8 |
| SA3 | S3,S4,R2 AND R5 |
| SA4 | S7,S8,R6 AND R3 |
| SA5 | S1,S2,R4 AND R7 |
| SA6 | S5,S6,R8 AND R1 |
| SA7 | S3,S4,R2 AND R5 |
| SA8 | S7,S8,R6 AND R3 |
| ⋮ | ⋮ |

$(1/2)x(n)+(1/2)x(n-1)$

| SAMPLE | SWITCHES CLOSED FOR SAMPLING | SWITCHES CLOSED FOR READ OUT |
|---|---|---|
| SA1 | S1 | R5',R6,R7,R8' |
| SA2 | S9 | -do- |
| SA3 | S2 | -do- |
| SA4 | S10 | -do- |
| SA5 | S3 | R7',R8,R1,R2' |
| SA6 | S11 | -do- |
| SA7 | S4 | -do- |
| SA8 | S12 | -do- |
| SA9 | S5 | R1',R2,R3,R4' |
| SA10 | S13 | -do- |
| SA11 | S6 | -do- |
| SA12 | S14 | -do- |
| SA13 | S7 | R3',R4,R5,R6' |
| SA14 | S15 | -do- |
| SA15 | S8 | -do- |
| SA16 | S16 | -do- |
| SA17 | S1 | R5',R6,R7,R8' |
| SA18 | S9 | -do- |
| SA19 | S2 | -do- |
| SA20 | S10 | -do- |
| ⋮ | ⋮ | ⋮ |

| SAMPLE | S1-S8 CLOSED | R1 AND R2 CLOSED | R3 CLOSED | SH1-SH8 CLOSED |
|---|---|---|---|---|
| SA1 | B1 | — | — | — |
| SA2 | B5 | B1 | — | — |
| SA3 | B2 | B5 | B1 | — |
| SA4 | B6 | B2 | B5 | B1 |
| SA5 | B3 | B6 | B2 | B5 |
| SA6 | B7 | B3 | B6 | B2 |
| SA7 | B4 | B7 | B3 | B6 |
| SA8 | B8 | B4 | B7 | B3 |
| SA9 | B1 | B8 | B4 | B7 |
| SA10 | B5 | B1 | B8 | B4 |
| SA11 | B2 | B5 | B1 | B8 |
| SA12 | B6 | B2 | B5 | B1 |
| ⋮ | ⋮ | ⋮ | ⋮ | ⋮ |

$(1/4)x(n)+(1/8)x(n-1)$

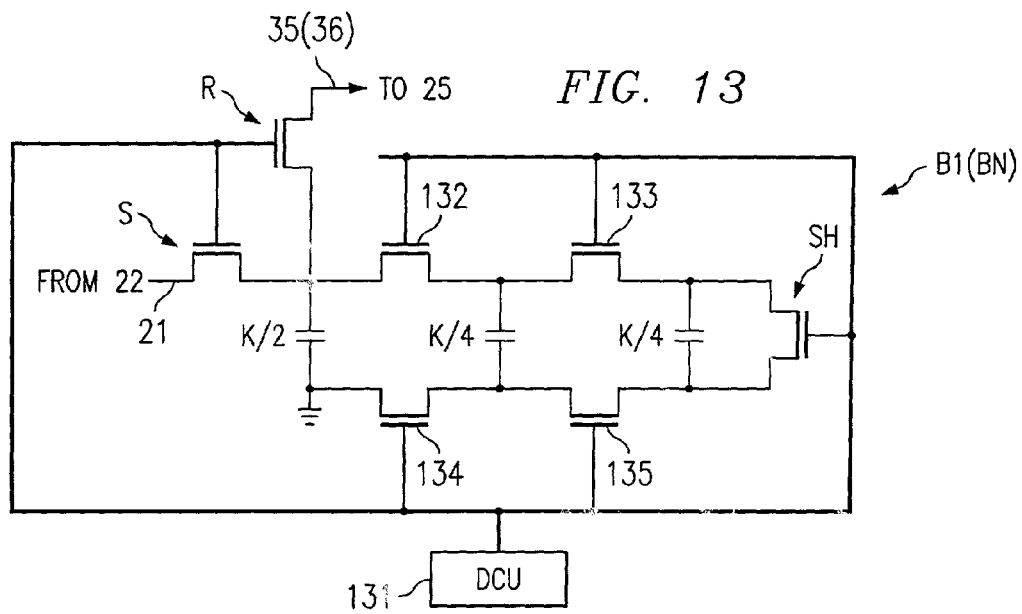
FIG. 13
FIG. 14
141 — TRANSFORM VOLTAGE WAVEFORM INTO CURRENT WAVEFORM
142 — USE CAPACITORS TO INTEGRATE SAMPLES OF CURRENT WAVEFORM
143 — PERFORM ANALOG SIGNAL PROCESSING (e.g. FILTERING) ON THE INTEGRATED SAMPLES
FIG. 15
FIG. 15A
FIG. 15B
FIG. 17
FIG. 17A
FIG. 17B
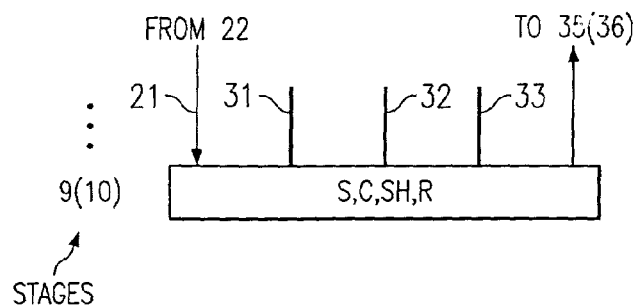
FIG. 16

FIG. 15A

| SAMPLE | SWITCHES CLOSED |
|---|---|
| SA1 | S1 |
| SA3 | S2 |
| SA5 | S3 |
| SA7 | S1 |
| SA9 | S2 |
| SA11 | S3 |
| SA13 | S1 |
| SA15 | S2 |
| SA17 | S3 |
| SA19 | S4 AND R1 |
| SA21 | S2 AND R1 |
| SA23 | S3 AND R1 |
| SA25 | S4 AND R1 |
| SA27 | S2 AND R1 |
| SA29 | S3 AND R1 |
| SA31 | S4 AND R1 |
| SA33 | S2 AND R1 |
| SA35 | S3 AND R1 |
| SA37 | S4 AND R2 |
| SA39 | S1 AND R2 |
| SA41 | S3 AND R2 |
| SA43 | S4 AND R2 |
| SA45 | S1 AND R2 |
| SA47 | S3 AND R2 |
| SA49 | S4 AND R2 |
| SA51 | S1 AND R2 |
| SA53 | S3 AND R2 |
| SA55 | S4 AND R3 |
| SA57 | S1 AND R3 |
| SA59 | S2 AND R3 |
| SA61 | S4 AND R3 |
| SA63 | S1 AND R3 |
| SA65 | S2 AND R3 |
| SA67 | S4 AND R3 |
| SA69 | S1 AND R3 |
| SA71 | S2 AND R3 |
| SA73 | S3 AND R4 |
| SA75 | S1 AND R4 |
| SA77 | S2 AND R4 |
| SA79 | S3 AND R4 |
| SA81 | S1 AND R4 |
| SA83 | S2 AND R4 |
| SA85 | S3 AND R4 |
| SA87 | S1 AND R4 |
| SA89 | S2 AND R4 |

FIG. 15B

| SA91 | S3 AND R1 |
|---|---|
| SA93 | S4 AND R1 |
| SA95 | S2 AND R1 |
| SA97 | S3 AND R1 |
| SA99 | S4 AND R1 |
| SA101 | S2 AND R1 |
| SA103 | S3 AND R1 |
| SA105 | S4 AND R1 |
| SA107 | S2 AND R1 |
| SA109 | S3 AND R2 |
| SA111 | S4 AND R2 |
| SA113 | S1 AND R2 |
| SA115 | S3 AND R2 |
| SA117 | S4 AND R2 |
| SA119 | S1 AND R2 |
| SA121 | S3 AND R2 |
| SA123 | S4 AND R2 |
| SA125 | S1 AND R2 |
| SA127 | S2 AND R3 |
| SA129 | S4 AND R3 |
| SA131 | S1 AND R3 |
| SA133 | S2 AND R3 |
| SA135 | S4 AND R3 |
| SA137 | S1 AND R3 |
| SA139 | S2 AND R3 |
| SA141 | S4 AND R3 |
| SA143 | S1 AND R3 |
| SA145 | S2 AND R4 |
| SA147 | S3 AND R4 |
| SA149 | S1 AND R4 |
| SA151 | S2 AND R4 |
| SA153 | S3 AND R4 |
| SA155 | S1 AND R4 |
| SA157 | S2 AND R4 |
| SA159 | S3 AND R4 |
| SA161 | S1 AND R4 |
| SA163 | S2 AND R1 |
| SA165 | S3 AND R1 |
| SA167 | S4 AND R1 |
| ⋮ | ⋮ |

FIG. 17A

| SAMPLE | SWITCHES CLOSED |
|---|---|
| SA1 | S1 |
| SA3 | S2 |
| SA5 | S3 |
| SA7 | S1 |
| SA9 | S2 |
| SA11 | S3 |
| SA13 | S1 |
| SA15 | S2 |
| SA17 | S3 |
| SA19 | S4 AND R1 |
| SA21 | S2 AND R1 |
| SA23 | S3 AND R1 |
| SA25 | S4 AND R1 |
| SA27 | S2 AND R1 |
| SA29 | S3 AND R1 |
| SA31 | S4 AND R1 |
| SA33 | S2 AND R1 |
| SA35 | S3 AND R1 |
| SA37 | S4 AND R2 |
| SA39 | S1 AND R2 |
| SA41 | S3 AND R2 |
| SA43 | S4 AND R2 |
| SA45 | S1 AND R2 |
| SA47 | S3 AND R2 |
| SA49 | S4 AND R2 |
| SA51 | S1 AND R2 |
| SA53 | S3 AND R2 |
| SA55 | S4 |
| SA57 | S1 |
| SA59 | S2 |
| SA61 | S4 |
| SA63 | S1 |
| SA65 | S2 |
| SA67 | S4 |
| SA69 | S1 |
| SA71 | S2 |
| SA73 | S9 AND R3 AND R4 |
| SA75 | S1 AND R3 AND R4 |
| SA77 | S2 AND R3 AND R4 |
| SA79 | S9 AND R3 AND R4 |
| SA81 | S1 AND R3 AND R4 |
| SA83 | S2 AND R3 AND R4 |
| SA85 | S9 AND R3 AND R4 |
| SA87 | S1 AND R3 AND R4 |
| SA89 | S2 AND R3 AND R4 |

FIG. 17B

| SA91 | S9 AND R1 |
|---|---|
| SA93 | S4 AND R1 |
| SA95 | S2 AND R1 |
| SA97 | S9 AND R1 |
| SA99 | S4 AND R1 |
| SA101 | S2 AND R1 |
| SA103 | S9 AND R1 |
| SA105 | S4 AND R1 |
| SA107 | S2 AND R1 |
| SA109 | S9 AND R2 |
| SA111 | S4 AND R2 |
| SA113 | S1 AND R2 |
| SA115 | S9 AND R2 |
| SA117 | S4 AND R2 |
| SA119 | S1 AND R2 |
| SA121 | S9 AND R2 |
| SA123 | S4 AND R2 |
| SA125 | S1 AND R2 |
| SA127 | S2 |
| SA129 | S4 |
| SA131 | S1 |
| SA133 | S2 |
| SA135 | S4 |
| SA137 | S1 |
| SA139 | S2 |
| SA141 | S4 |
| SA143 | S1 |
| SA145 | S2 AND R4 AND R9 |
| SA147 | S3 AND R4 AND R9 |
| SA149 | S1 AND R4 AND R9 |
| SA151 | S2 AND R4 AND R9 |
| SA153 | S3 AND R4 AND R9 |
| SA155 | S1 AND R4 AND R9 |
| SA157 | S2 AND R4 AND R9 |
| SA159 | S3 AND R4 AND R9 |
| SA161 | S1 AND R4 AND R9 |
| SA163 | S2 AND R1 |
| SA165 | S3 AND R1 |
| SA167 | S4 AND R1 |
| ⋮ | ⋮ |

*FIG. 18*
| SAMPLES | SWITCHES CLOSED |
|---|---|
| SA1,SA3,...SA17 | S1 |
| SA19,SA21,...SA35 | S2 AND R1 |
| SA37,SA39,...SA53 | S3 AND R1,R2 |
| SA55,SA57,...SA71 | S4 |
| SA73,SA75,...SA89 | S1 AND R2,R3,R4 |
| SA91,SA93,...SA107 | S2 AND R1,R3,R4 |
| SA109,SA111,...SA125 | S3 AND R1,R2,R4 |
| SA127,SA129,...SA143 | S4 |
| SA145,SA149,...SA161 | S1 AND R2,R3,R4 |
| ⋮ | ⋮ |
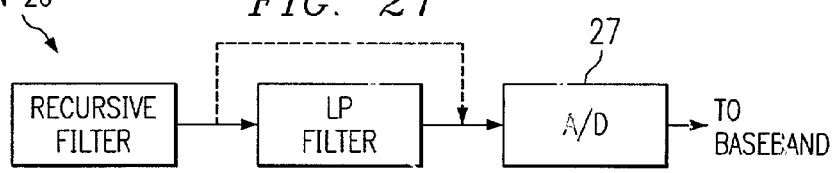
*FIG. 21*
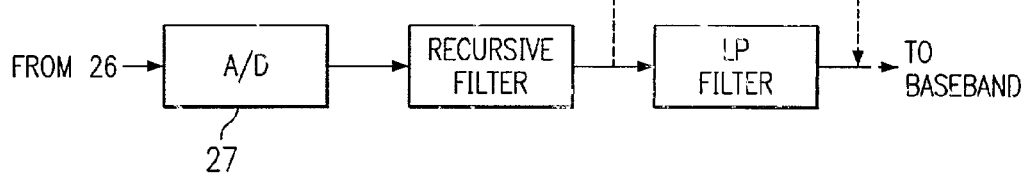
*FIG. 22*
*FIG. 24*
| SAMPLES | SWITCHES CLOSED |
|---|---|
| SA1,SA3,...,SAJ−1 | S1 |
| SA2,SA4,...,SAJ | S2 |
| SAJ+1,...,SA2J−1 | S3 AND R1 AND R2 |
| SAJ+2,...,SA2J | S4 AND R1 AND R2 |
| SA2J+1,...,SA3J−1 | S1 AND R3 AND R4 |
| SA2J+2,...,SA3J | S2 AND R3 AND R4 |
| SA3J+1,...,SA4J−1 | S3 AND R1 AND R2 |
| ⋮ | ⋮ |

DIGITALLY CONTROLLED ANALOG RF FILTERING IN SUBSAMPLING COMMUNICATION RECEIVER ARCHITECTURE

This application claims the priority under 35 USC 119(e)(1) of the following copending U.S. provisional applications: 60/286,421, 60/286,564, 60/286,736, 60/286,787, and 60/286,788, all filed on Apr. 25, 2001; 60/343,673 filed on Dec. 29, 2001; and 60/276,716 and 60/276,727, both filed on Mar. 16, 2001. All of the aforementioned provisional applications are incorporated herein by reference.

FIELD OF THE INVENTION

The invention relates generally to communication receivers and, more particularly, to subsampling receiver architectures.

BACKGROUND OF THE INVENTION

A recent trend in direct-conversion receivers is to use subsampling. The basic approach is to sample the RF signal at an integer fraction of the carrier frequency greater than twice the bandwidth of the modulating signal. Spectral images of the modulating signals are repeated and down-conversion can be achieved by a low pass filter.

A general scheme based on subsampling operation is presented in D. H. Shen et al., "A 900-MHz RF front-end with integrated discrete-time filtering," *IEEE JSSC*, Vol. 31, pp. 1945–1954, December 1996 (hereinafter Shen), and is shown in FIG. 1. The RF input is sampled-and-held and followed directly by discrete time analog signal processing. The baseband signal is converted using an A/D converter. Sampling the carrier frequency $f_c$ at a rate $f_s$ results in spectral images located at $nf_s \pm f_c$ where n is an integer. A desired spectral image can be filtered using a discrete time analog filter. In this approach, the lowest power solution would involve a tradeoff analysis between the input rate of the A/D converter and the complexity of anti-aliasing filters (see Shen) by appropriate selection of $f_s$ in relation with $f_c$. In this approach, channel select filtering, demodulation and baseband processing are done in the digital domain following the A/D converter. The final stages of the multi-stage analog filters can also be used to reduce the adjacent channel interferers, thereby reducing the dynamic range requirement and power dissipation of the A/D converter.

E. Cijvat et al, "A 1.8 GHz subsampling CMOS down-coversion circuit for integrated radio applications," *ISCAS* 1998, Vol. 3, pp. 149–152, discloses a subsampling mixer implemented for 1.8 GHz RF system. The mixer is implemented using a track-and-hold circuit. A differential OTA is used to transfer the sampled charge to the output in order to cancel the charge feed-through and to attain high linearity. The speed of OTA determines the maximum $f_s$.

Another example of the subsampling approach is disclosed in A. Rofourgaran et al., "A single-chip 900-MHz spread-spectrum wireless transceiver in 1 um CMOS. II. Receiver design," *IEEE JSSC*, Vol. 33, pp. 535–547, April 1998, for a short-distance wireless binary FSK transceiver at 900 MHz. This approach substantially reduces power dissipation by hard-limiting the filtered output of a subsampling mixer. The high frequency images are rejected by −60 dB using a switched capacitor analog filter. The limiter serves to act as a 1-bit A/D converter which provides an over-sampled down-converted baseband signal. The signal is decoded using a 1-bit FSK demodulator. The AGC functionality is achieved using the filter, limiter and demodulator. This structure is simpler than the general architecture that typically requires a multibit A/D converter and VGAs, and thereby saves power. However, its application is not directly extendable to general modulation schemes.

Conventional subsampling receiver designs eliminate the need for IF filters, image-reject mixers, image reject filters and analog I/Q branches, thereby permitting a high level of integration. Further, the LO (local oscillator) in such designs operates at a much lower frequency than $f_c$. However, this design trades one set of problems for another. Exemplary disadvantages in such receivers typically include sensitivity to clock jitter and poor linearity.

Conventional receivers based on the subsampling principle require sample-and-hold (S/H) or track-and-hold stages operating at the IF rate. The signal-to-noise ration of such stages are limited by the clock jitter and settling time requirement of the S/H. Such stages cannot practically operate at RF frequencies because the required power dissipation will be prohibitively large for the required dynamic range performance (dictating quick settling time) and sampling frequency (dictating frequency aliasing).

It is therefore desirable to provide a subsampling receiver architecture that avoids problems such as those mentioned above with respect to the prior art.

A subsampling receiver architecture according to the invention can advantageously avoid problems such as mentioned above in the downconversion of a first periodic voltage waveform into a second periodic voltage waveform. A plurality of temporally distinct samples respectively indicative of areas under corresponding half-cycles of the first voltage waveform are obtained, and the samples are combined to produce the second voltage waveform. According to exemplary embodiments of the invention, the samples can also be manipulated to implement a filtering operation such that the second voltage waveform represents a down-converted, filtered version of the first voltage waveform.

BRIEF DESCRIPTION OF THE DRAWINGS

FIG. 1 diagrammatically illustrates an example of a conventional subsampling receiver architecture.

FIG. 2 diagrammatically illustrates pertinent portions of exemplary embodiments of a multi-tap digital subsampling receiver architecture according to the invention.

FIG. 4 graphically illustrates exemplary signals of FIGS. 2 and 3.

FIGS. 5 and 5A illustrate in tabular format examples of how the digital control unit of FIG. 3 can control the switches of FIG. 3.

FIG. 13 diagrammatically illustrates further exemplary embodiments of the banks of FIG. 10.

FIG. 14 illustrates exemplary operations which can be performed by the embodiments of FIGS. 2–13.

FIG. 15 illustrates how FIGS. 15A and 15B are to be viewed together.

FIGS. 15A and 15B illustrate in tabular format exemplary operations which can be performed by the architecture of FIG. 3.

FIG. 16 diagrammatically illustrates exemplary embodiments of the invention which permit resetting the IF amplifier of FIG. 3.

FIG. 17 illustrates how FIGS. 17A and 17B are to be viewed together.

FIGS. 17A and 17B illustrate in tabular format exemplary operations which can be performed by the embodiments of FIG. 16.

FIG. 18 illustrates in tabular format exemplary operations which can be performed by the embodiments of FIG. 3.

FIGS. 21 and 22 illustrate exemplary positioning of a recursive FIR filter for cooperation with the differential filter of FIG. 20.

FIG. 24 illustrates in tabular format exemplary operations which can be performed by the embodiments of FIG. 23.

DETAILED DESCRIPTION

Figure 3:
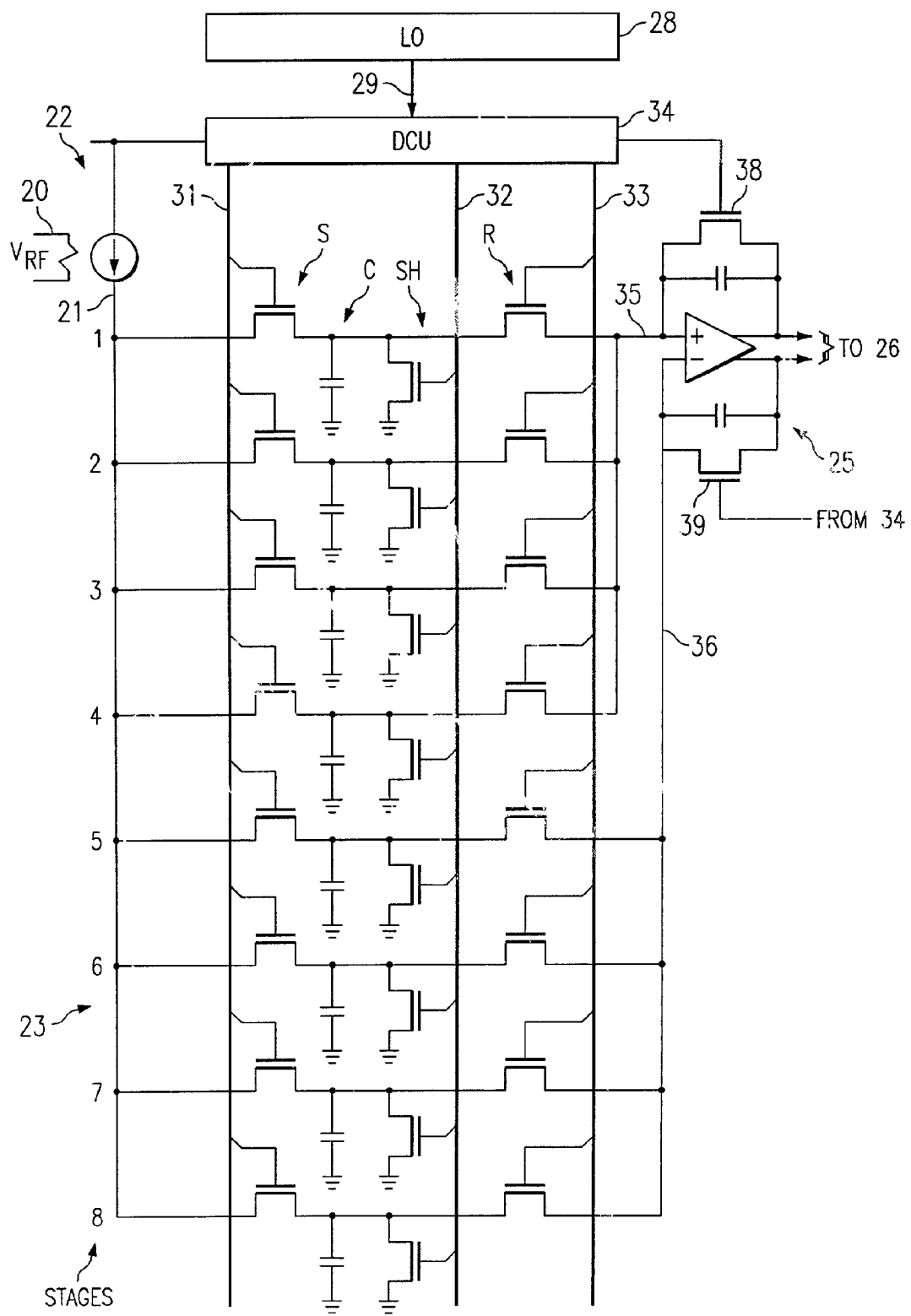
FIGS. 3 and 3A diagrammatically illustrate exemplary embodiments of portions of the multi-tap digital subsampling receiver architecture of FIG. 2.

FIG. 2 diagrammatically illustrates pertinent portions of exemplary embodiments of a subsampling communication receiver according to the invention. The subsampling receiver architecture of FIG. 2 includes an input 20 for receiving the voltage waveform of a communications signal, for example an RF communication signal. This voltage waveform is applied to a low noise transconductance amplifier (LNTA) 22 which can use conventional techniques to transform the voltage waveform at 20 into a corresponding current waveform at 21. In some embodiments, the LNTA 22 can include a conventional low-noise amplifier (LNA) followed by a conventional transconductance amplifier (TA). The current waveform at 21 is applied to a switch and capacitor network 23. Switches in the network 23 are operable for sampling the current waveform, and capacitors in the network 23 are operable for integrating the current waveform samples. A digital control unit (DCU) controls the operation of the switches in the switch and capacitor network 23. At 29, the DCU receives oscillator signals from a local oscillator (LO). The switch and capacitor network 23 has an output for providing the aforementioned integrated current samples to an IF (intermediate frequency) amplifier 25 (also referred to as IFA) whose output drives an analog signal processing section 26, which in turn drives an A/D converter 27. The digital baseband signal output from the A/D converter 27 is passed on to a baseband processing portion of the receiver.

FIG. 3 diagrammatically illustrates exemplary embodiments of pertinent portions of the receiver of FIG. 2, which portions operate to mix the input signal from a higher to lower frequency, for example, from RF to IF. In particular, FIG. 3 illustrates the LNTA 22 coupled at 21 to the switch and capacitor network 23. FIG. 3 also illustrates an exemplary DCU 34 which controls various switches (e.g., transistor switches) in the network 23 via control busses 31, 32 and 33. The switch and capacitor network 23 includes outputs which are respectively coupled to the non-inverting and inverting inputs 35 and 36 of the IF amplifier 25. The LNTA 22 (e.g. a linear LNTA) and the IF amplifier 25 can be implemented, for example, with conventionally available designs. In some embodiments, the LNTA replaces the LNA of conventional designs. In other embodiments, an LNA with a gain greater than 1 is provided upstream of the LNTA.

The switch and capacitor network 23 includes a plurality of stages (eight in the example of FIG. 3), each of which includes a sampling switch S, a capacitor C, a shorting switch SH, and a read switch R. The eight stages of the network 23 of FIG. 3 are respectively designated by the numerals 1–8. The sampling switches S are controlled by the DCU control bus 31, the shorting switches SH are controlled by the DCU bus 32, and the read switches R are controlled by the DCU bus 33. Each of the sampling switches S has an input connected at 21 to the output of the LNTA 22. Each of the sampling switches S has an output coupled to its corresponding capacitor C, and each shorting switching SH is connected for selectively shorting the terminals of its corresponding capacitor C. Each read switch R has an input connected to the output of its corresponding sampling switch S, and has an output connected to the IF amplifier 25. The read switches R of stages 1–4 have their outputs coupled to the non-inverting input 35 of the IF amplifier 25, and the read switches R of stages 5–8 have their outputs coupled to the inverting input 36 of the IF amplifier 25. The digital control unit 34 also provides control signals for controlling transistor switches 38 and 39. Switch 38 selectively shorts the terminals of a capacitor coupling the output of the IF amplifier to its non-inverting input 35, and the switch 39 selectively shorts the terminals of a capacitor which couples the output of IF amplifier 25 to its inverting input 36.

The IF amplifier 25 is shown in FIGS. 2 and 3 for illustrative purposes. However, the IF amplifier 25 can be considered as a part of the analog signal processing section 26. In some embodiments, the IF amplifier 25 can be, for example, a continuous time buffer amplifier, a switched capacitor analog baseband filter, or an impedance transformer. The switch and capacitor network 23 includes a high impedance node for sustaining a down-converted information-carrying signal which needs subsequent processing. The IF amplifier 25 operates to transfer the information to the analog signal processing section 26 with an option to filter it actively or passively while presenting it to section 26.

In some embodiments, the LNTA 22 is AC coupled to the switched capacitor network 23, and in other embodiments, the LNTA is DC coupled to the switched capacitor network 23. Capacitively coupling the LNTA output to the sampling switches S blocks DC offset build-up which could otherwise occur due to offsets in the LNTA output.

In some embodiments, the shorting switches SH of FIG. 3 can connect the top plate of the sampling capacitors C to a voltage source. Hence, each switch SH may be used to reset the initial charge on the corresponding sampling capacitor C to a predetermined value which would be the common mode voltage of the sampling capacitor C as well as the common mode input for the IF amplifier.25.

In some embodiments, the IF amplifier 25 can be used as a buffer, or may itself be a switched capacitor filtering stage which processes the data on the sampling capacitors C while simultaneously presenting that data to the analog signal processing section 26.

In some embodiments, the shorting switches SH can be used to place a common mode voltage in the network 23 while destroying the charges held on the corresponding capacitors C (that is, while resetting the charges on the corresponding capacitors).

Hereinafter, the following nomenclature will be observed. The sampling switch S of a given stage will be designated as S followed by the number of that stage. For example, S1 designates the sampling switch S of stage 1 and S5 designates the sampling switch S of stage 5. Similarly, R1 designates the read switch R of stage 1 and R6 designates the read switch R of stage 6.

Figure 3A:
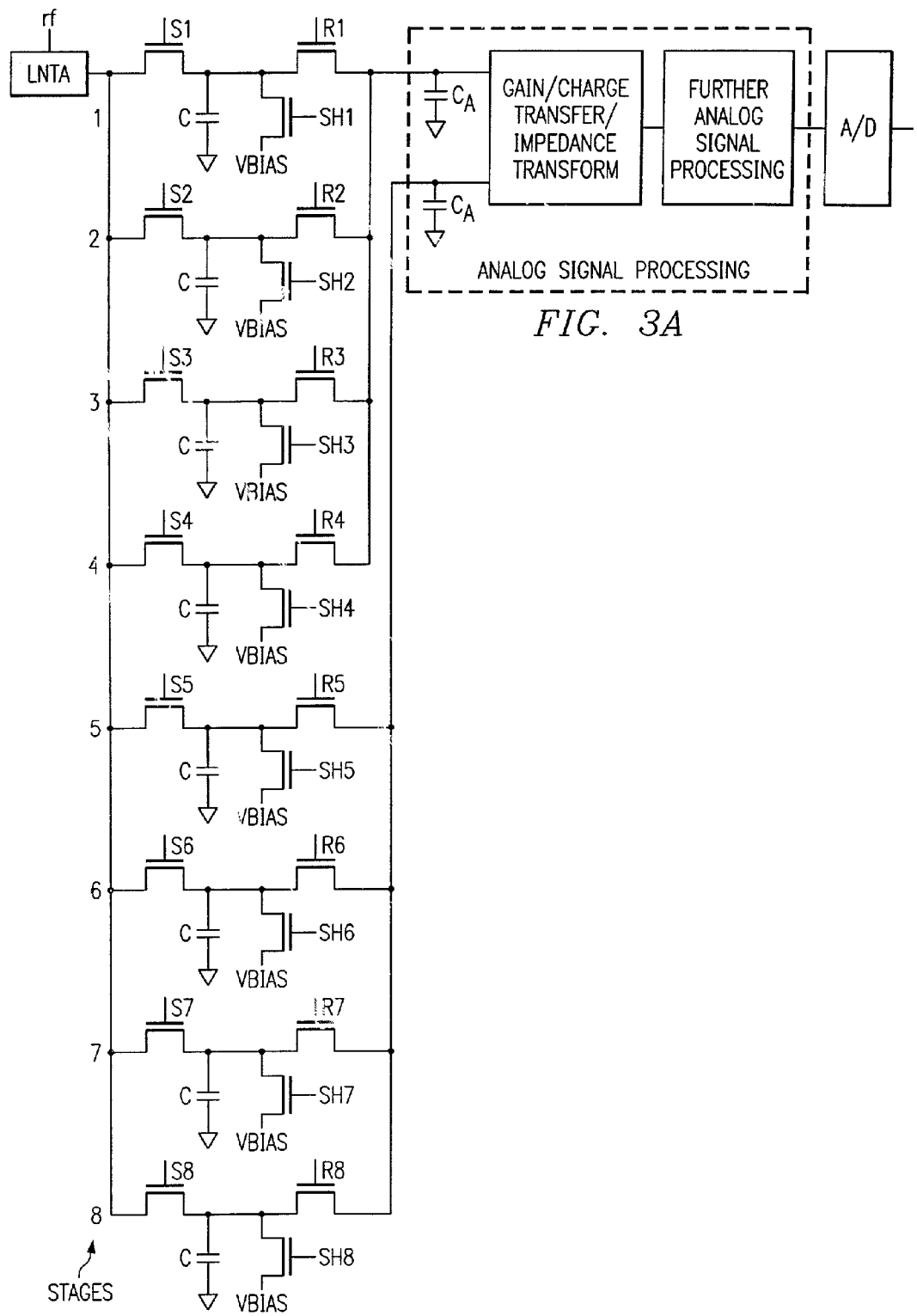

FIG. 3A demonstrates controlling the common mode voltage of one embodiment by resetting the voltage on the sampling capacitors to arbitrary VBIAS before new samples are integrated. Instead of discharging the sampling capacitors after they have been read by the IF amplifier, a predetermined voltage can be placed on them using the shorting switches SH as controlled by the DCU. This feature allows controlling the common mode voltage in this part of the receive chain by the DCU using the SH1–SH8 lines in the embodiment of FIG. 3A.

FIG. 4 graphically illustrates a relationship between the local oscillator signals at 29 and the current waveform at 21 in FIG. 2. As shown in FIG. 4, the local oscillator signals 29 include a signal LO+ and a signal LO−. The signals LO+ and the LO− can be generated in conventional fashion by the local oscillator of FIG. 2 in response to the input voltage waveform 20. The signal LO+ is high during the positive half cycles of the current waveform 21, and is low during the negative half cycles, and the signal LO− is low during the positive half cycles of the current waveform 21 and high during the negative half cycles. Thus, the signal LO+ can be used to sample the positive half cycles of the current waveform, and the signal LO− can be used to sample the negative half cycles of the current waveform.

As shown in the example of FIG. 4, a first current waveform sample SA1 corresponds to a positive half cycle of the current waveform, a second current waveform sample SA2 corresponds to the immediately following negative half cycle of the current waveform 21, a third current waveform sample SA3 corresponds to the immediately following positive half cycle of the current waveform, etc. Thus, the DCU 34 can gate the signals LO+ and LO− appropriately to the control inputs of the sampling switches S in order to permit the corresponding capacitors C to integrate the portion of the current waveform (positive half cycle or negative half cycle) that is sampled by the associated sampling switch S. The DCU 34 can also gate the signals LO+ and LO− appropriately to operate the read switches R as desired to dump the stored charge from the capacitors C to the IF amplifier 25. In the example of FIG. 4, the sampling and integrating operations are performed at the Nyquist rate of the RF signal.

FIG. 5 illustrates in tabular format one example of how the DCU 34 of FIG. 3 can use signals derived from LO+ and LO− to control the sampling switches and read switches of FIG. 3. In the example of FIG. 5, the samples SA1–SA10 correspond to the current waveform 21 as shown in FIG. 4. The sample SA11 of FIG. 5 merely represents the next positive half cycle sample (not shown in FIG. 4). FIG. 5 illustrates which sampling and read switches of FIG. 3 are closed by the DCU 34 during the various sampling intervals illustrated in FIG. 4. In FIG. 5 (and also in FIGS. 5A, 6, 6A, 8, 8A, 12, 15A–15B, 17A–17B and 18) the illustrated sampling and read switches are open except during the sampling intervals indicated. The example of FIG. 5 illustrates sampling and read out at the Nyquist rate of the RF carrier signal. The IF amplifier 25 (see also FIG. 3) removes the sampled charged from the sampling capacitors C at this rate and subsequently presents it to the analog signal processing section 26.

Referring now to FIGS. 3–5, it can be seen from the example of FIG. 5 that the positive half cycles of the current waveform are integrated by the capacitors of stages 1–4, and the negative half cycles of the current waveform are integrated by the capacitors of stages 5–8. The integrated positive half cycles are sequentially read out to the non-inverting input 35 of the IF amplifier 25, and the integrated negative half cycles are sequentially read out to the inverting input 36 of the IF amplifier 25. Also in the example of FIG. 5, the positive and negative half cycles are read out to the IF amplifier alternately, in time-interleaved fashion. This provides full wave rectification. Although not explicitly shown in FIG. 5, each shorting switch SH can be operated to short the associated capacitor at any time after the charge has been read out via the corresponding read switch R and before the next closing of the corresponding sampling switch S.

The accumulation of charge flowing from the LNTA output into the sampling capacitor for half of the RF period results in direct-conversion to DC. The IF frequency of the waveform at 35, 36 can be arbitrarily changed by modifying the frequency of the local oscillator (LO) just as in conventional mixers.

Referring to FIGS. 3 and 4, because the capacitors C integrate the current waveform during an entire half cycle thereof for each sample SA1–SA10, any clock jitter in the signals LO+ and LO− (and in gated signals derived therefrom) will tend to have a relatively minor effect on the sample stored in the capacitor, because the integration operation of the capacitor determines the area beneath the waveform in the sampled half cycle. Thus, the current integration operation will typically be affected much less by clock jitter than would a conventional voltage sampling operation. The charge accumulated on a given sampling capacitor during an integration operation is manifested as a voltage on that capacitor, so the analog signal processing section 26 can use well-known conventional discrete time analog signal processing techniques to manipulate the voltages presented by the sampling capacitors.

FIG. 5A shows another example of timing generated from the DCU which relaxes the operating speed requirements of the IFA. The expression "-do-" in FIG. 5A and elsewhere means "same as above." In this example, while four samples are accumulated, four previous samples are read out to the IFA, two combined together on the positive side and two combined together on the negative side. This is an example of "spatial averaging" in which two distinct capacitors (on each side) holding different samples are read together for twice as long. Reading these two capacitors together presents the average of the two to the IFA input which performs a decimation in rate by a factor of two. This can be extended to more than two capacitors on the same side (positive or negative), so more than two samples can be spatially averaged, with the data rate decimated by the number of capacitors averaged.

Figures 6, 7:
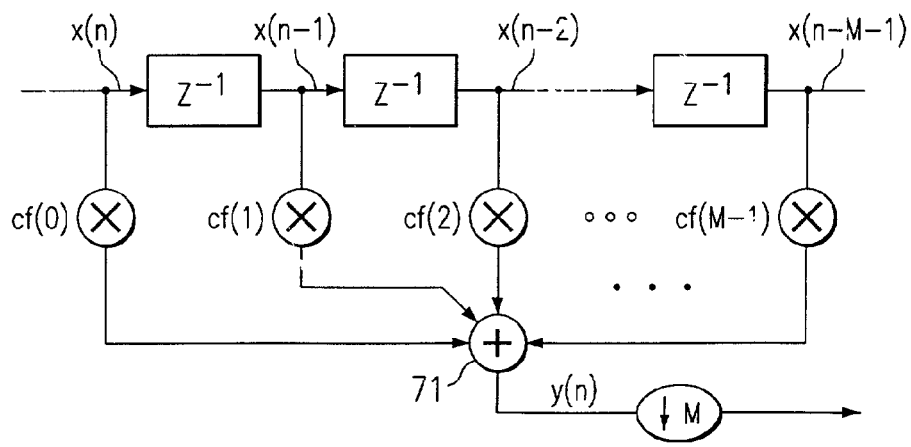
FIGS. 6 and 6A illustrate in tabular format further examples of how the digital control unit of FIG. 3 can control the switches of FIG. 3.
FIG. 7 diagrammatically illustrates a general example of an FIR filter which can be implemented by the embodiments of FIG. 3.

FIG. 6 illustrates in tabular format another example of how the DCU 34 of FIG. 3 can control the sampling switches S and read switches R. In the example of of the current waveform before the capacitor is read out to the IF amplifier, and each of the capacitors of stages 5–8 integrates two successive negative half cycles of the current waveform before being read out to the IF amplifier. Thus, samples SA1 and SA3 are both integrated by the capacitor of stage 1 (via operation of sampling switch S1) before the stored charge is read out (via operation of read switch R1) during samples SA4 and SA5. Similarly, the capacitor of stage 5 integrates the negative half cycles associated with SA2 and SA4 (via operation of sampling switch S5) before being read out (via operation of read switch R5) during samples SA5 and SA6. The shorting switches SH can short the capacitors after they are read out and before they are charged again. In general, a given capacitor can integrate as many samples as desired, but it should be ensured that the charge on the capacitor does not overflow under worst case operating conditions. This includes, for example, ensuring that the largest interferer does not overload the capacitor or the input stage of the IF amplifier.

FIG. 6 demonstrates an example of a concept referred to herein as "temporal summation." In FIG. 6, on each side (positive and negative), two temporally distinct samples are accumulated on the same sampling capacitor before being read out. With the temporal summation illustrated in the example of FIG. 6, the output rate is decimated in time by a factor of two.

Figures 6A, 8:
FIGS. 8 and 8A illustrate in tabular format examples of how the digital control unit of FIG. 3 can control the switches of FIG. 3 to implement desired FIR filter functions.

FIG. 6A demonstrates an example of "temporal summation and spatial averaging" where two temporally distinct samples are accumulated together on each of two sampling capacitors on each side before read out. The decimation factor is now equal to 4 in contrast to the previous examples demonstrating only temporal summation (e.g., FIG. 6) or spatial averaging (e.g., FIG. 5A), however the end result is to accumulate the average of four samples. The same end result can be obtained using temporal summation or spatial averaging exclusively (adjusting gain by scaling capacitors).

FIG. 7 diagrammatically illustrates an exemplary generalized FIR filter function which can be realized by the embodiments of FIGS. 2–4. The generalized FIR filter function of FIG. 7 includes M taps. A digital sample at time n is multiplied by a coefficient cf(0), a sample at time n−1 is multiplied by a coefficient cf(1), a sample at time n−2 is multiplied by a coefficient cf(2), and a sample a time n−M−1 is multiplied by a coefficient cf(M−1). The results of the coefficient multiplications are summed together at 71 and decimated by a factor of M at 72.

FIG. 8 illustrates in tabular format exemplary operations which can be performed by the DCU 34 of FIG. 3 to realize the following FIR filter:

$$\tfrac{1}{2}[x(n)]+\tfrac{1}{2}[x(n-1)].$$

The coefficients having a value ½ can be produced by closing two of the sampling switches S during a given sample (e.g. close S1 and S2 during SA1), thereby dividing the current from the LNTA 22 between two capacitors, each receiving ½ of the sampled current. Then, only one of the two capacitors is read out, thereby providing the desired coefficient value of ½. For example, a ½ coefficient for sample SA1 is realized by closing read switch R2 during sample SA3 (after both sample switches S1 and S2 were closed during SA1), and a ½ coefficient for sample SA2 is realized by closing read switch R5 during sample SA3 (after both sample switches S5 and S6 were closed during SA2). As discussed above, switches SH can short their respective capacitors any time between read out (if the capacitor was even read) and the next sample operation. The closing of two read switches simultaneously (e.g. R2 and R5 during SA3) provides decimation by a factor of two in this example. Other FIR filters with any desired coefficients, and any desired number of taps and decimation factor, can be implemented, for example, by providing more than 8 stages and/or varying the number of sampling switches S and read switches R that are closed during each sample. It may be advantageous to close the same number of sampling switches S during each sample, so the LNTA sees a constant load.

FIG. 8 demonstrates an example of a concept referred to herein as "sliding window" integration. Sliding window integration is an integration technique over multiple time samples. In FIG. 8, each sample is obtained by integrating the LNTA output on two sampling capacitors, so each individual capacitor has half the voltage due to the two-way current split during integration. This spatial splitting of the sample over two distinct capacitors permits that sample to be used during two distinct read out cycles. In the example of FIG. 8, the sliding window integration technique sums two temporally distinct samples during any given read out cycle. During the next successive read out cycle, two temporally distinct samples are again summed, but with the time window shifted by one sample, so one of the samples summed in the previous read out cycle is summed again in the next read out cycle. This is illustrated, for example, by noting that sample SA1 is split between stages 1 and 2, which stages are respectively read out during samples SA2 and SA3; sample SA2 is split between stages 5 and 6, which stages are respectively read out during samples SA3 and SA4; and sample SA3 is split between stages 3 and 4, which stages are respectively read out during samples SA4 and SA5. Using the sliding window integration technique, read out operations can be performed at the Nyquist rate of the RF carrier, but with temporal summation. The sliding window concept can be extended to longer time summation windows wherein the LNTA output is integrated on any desired number of capacitors, for example all capacitors in each of two or more banks of capacitors (described in more detail below), so that charge corresponding to a given sample can be included in as many consecutive read out cycles as desired.

The sliding window integration technique can be used to construct a filter with triangular coefficients which place two-zeros on the fold-over frequencies. It is important to realize that summing samples in time is equivalent to decimating the output of a moving average (MA) filter with unity coefficients by a factor equal to the number of accumulated samples as depicted in FIG. 7.

Decimation by a factor of M results in folding of the frequency band M−1 times. The transfer function of such a filter before decimation exhibits single zeros at the frequencies which fold over to DC. The intended receiver proposes very low-IF reception or even zero-IF so that the aliasing frequencies fall either very close to (for low-IF) or exactly on the zeros (for zero-IF) and are rejected by "strategically" placed zeros.

The attenuation by a single zero many not be enough if strong interferences reside at the fold-over frequencies and it is important to increase the rejection of such frequencies by increasing the number of zeros at these fold-over frequencies. Filters with triangular coefficients place two zeros at these aliasing frequencies and provide a much stronger rejection to them. Such filters can be implemented using the sliding window integration approach. Such a filter can be constructed, for example, using any of the techniques described herein that realize fractional coefficients. In some embodiments, a predetermined fraction can be chosen based on the desired coefficient value, and the remaining charge can be discarded. Alternatively, all of the sampled charge can be retained (i.e. do not destroy unwanted charge) while still realizing triangular coefficient filtering.

Figures 8A, 10:
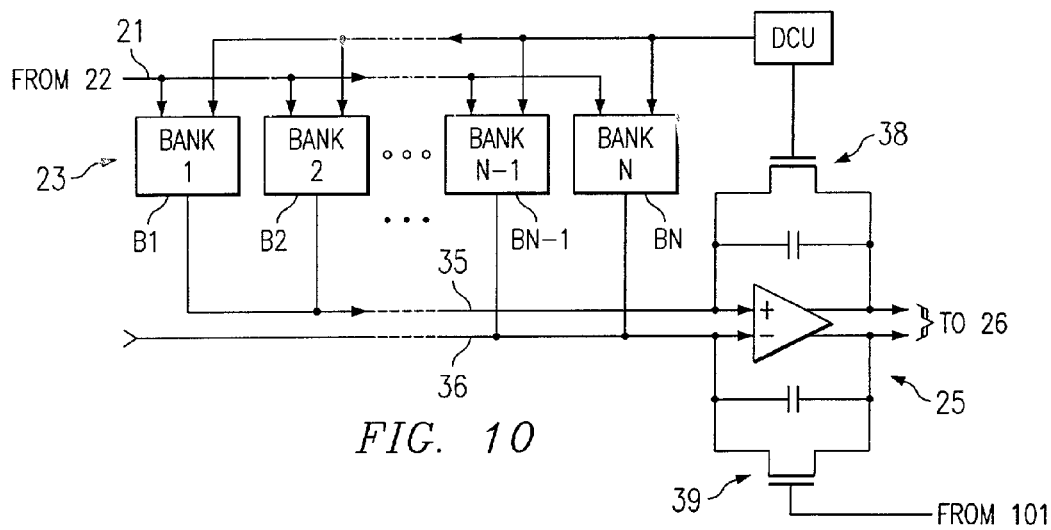
FIG. 10 diagrammatically illustrates exemplary embodiments of the invention wherein each capacitor of FIG. 3 is replaced by a bank of capacitors.
Figure 8B:
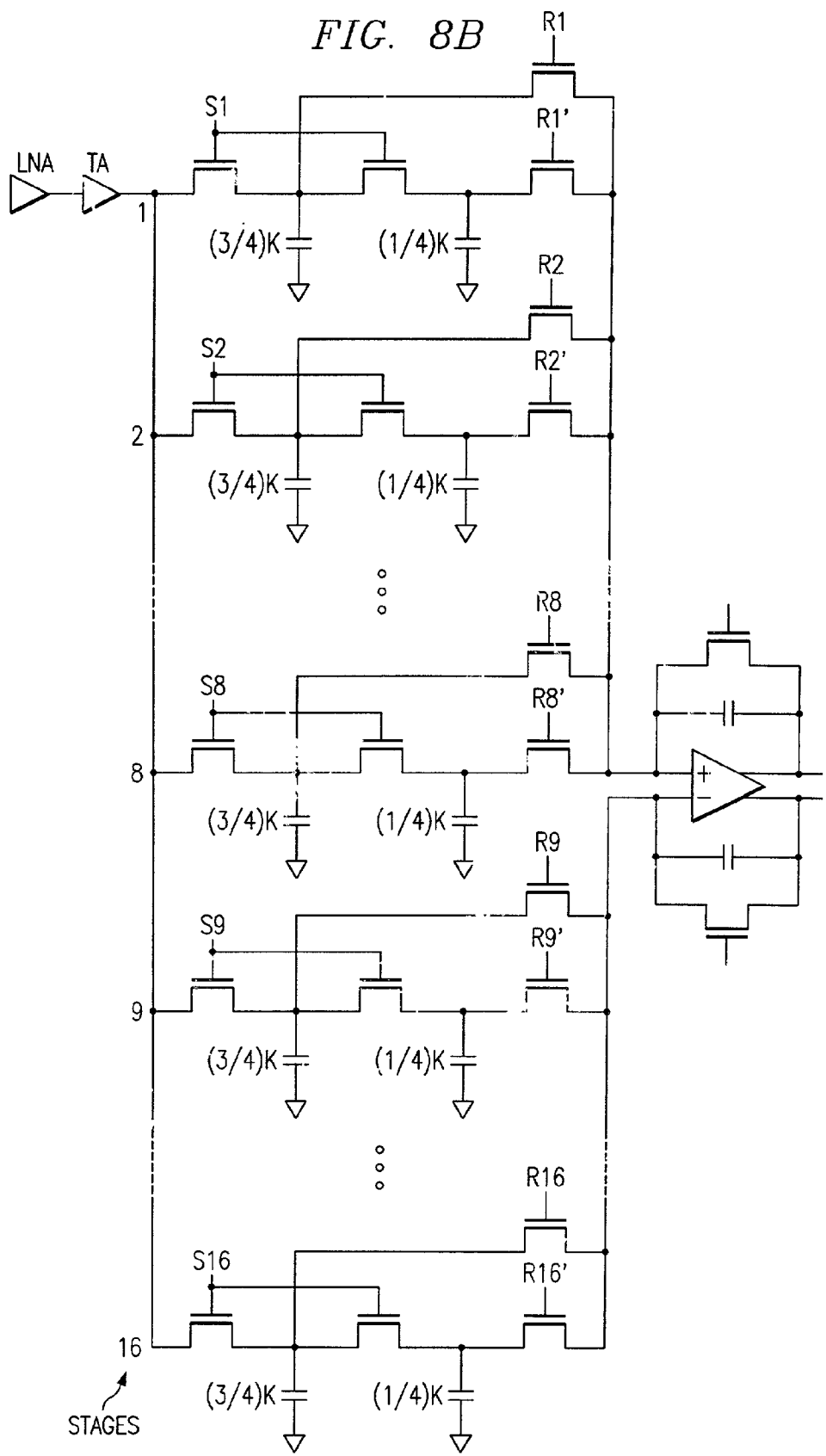
FIG. 8B diagrammatically illustrates exemplary embodiments of the invention generally similar to those of FIG. 3 but with added components for realizing triangular filter coefficients.

One exemplary embodiment of a filter realizing the triangular coefficients 1, 3, 3, 1 is shown in FIG. 8B. This structure has twice as many sampling capacitors as shown in FIG. 3 with the property that the two capacitors of each stage split the total integrating capacitance value K into fractional values of K/4 and ¾K. The read switches R1'–R16' are used to read out the K/4 samples. A total of eight sampling capacitors are seen by the plus side of the IF amplifier and the same number by the minus side. Four weighted samples are accumulated with the ratio 1:3:3:1 and read out and decimated by M/2 instead of M (M=4 in this case). FIG. 8A shows the timing for this example.

Note from FIG. 8A that the read out rate is twice as fast as the rate suggested by reading four accumulated samples, due to the sliding window integration approach. This embodiment shows spatial averaging of 4 weighted samples and provides improved rejection to the aliasing frequencies. A time accumulation of weighted samples can also be done by providing appropriate capacitor size to the LNTA in the sampling phase. However, in this approach, the LNTA will see a varying output load.

The above example may also be extended to longer time accumulation on each sampling capacitor shown in FIG. 8B. Instead of accumulating one sample on one sampling capacitor (realized as two caps which make C together and can be splitted), we can accumulate an arbitrary number of samples and move to the next capacitor. In this case, one zero will be placed to the fold-over frequencies corresponding to decimation in time on one sampling capacitor. The fold-over frequencies due to spatial averaging with weighted coefficients will see two-zeros and will be rejected by a greater amount.

Referring again to FIG. 3A, the exemplary embodiments shown therein demonstrate passive infinite impulse response (IIR) filtering obtained by charge sharing the contents of the relevant sampling capacitors (selected by DCU for read operation) with another capacitor $C_A$. The read out samples are charge shared with $C_A$ when the respective sampling capacitors are shorted with $C_A$. This splits the total charge on the aggregate of read out capacitors and previous charge on $C_A$ according to the capacitor ratio of $C_A$ to the aggregate of read out capacitors. $C_A$ is never reset, and consequently creates a low-pass filter whose pole is determined by the ratio of the aggregate of sampling capacitors shorted together with $C_A$ to the value of $C_A$. The filtered down-converted signal is transferred by an IFA or a gain block which may also be viewed as an impedance transformer and which presents this data to blocks that perform further analog signal processing.

Figures 9, 12:
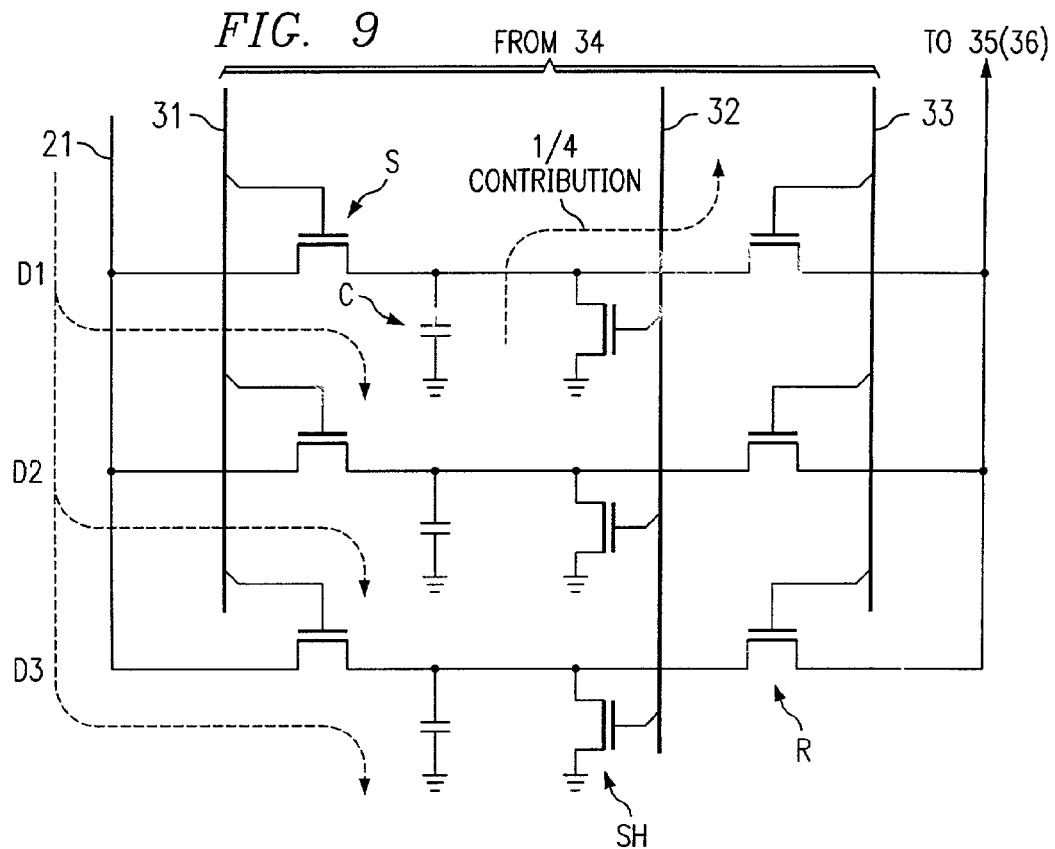
FIG. 9, taken in conjunction with FIG. 3, diagrammatically illustrates exemplary dummy sampler embodiments according to the invention.
FIG. 12 illustrates in tabular format an example of how the digital control unit of FIG. 11 can control the switches of FIG. 11 to implement a desired FIR filter function.

FIG. 9 diagrammatically illustrates exemplary dummy stage embodiments which can be alternatively used to generate various fractional coefficients. There are three dummy stages D1, D2 and D3, in the example of FIG. 9. Each dummy stage includes a sampling switch S, a capacitor C, a shorting switch SH, and a read switch R. The sampling switches, shorting switches and read switches are respectively controlled by the DCU busses 31, 32 and 33. By closing the sampling switches S in all of the dummy stages D1–D3, while the sampling switch of one of the stages 1–8 of FIG. 3 is also closed, the sampled current is divided four ways, thereby permitting realization of a coefficient of 1, ¾, ½, or ¼, depending on how many of the capacitors in dummy stages D1–D3 are read when the associated capacitor of stages 1–8 is read. The shorting switches SH of the dummy stages D1–D3 can be activated after the dummy capacitors are read, thereby ensuring that all dummy capacitors (whether read or not) are discharged before the next use of the dummy stages. Note that two sets of the dummy stages shown in FIG. 9 can be provided, one for cooperation with the stages 1–4 of FIG. 3 and the other for cooperation with the stages 5–8 of FIG. 3.

FIG. 10 diagrammatically illustrates pertinent portions of further exemplary embodiments of a subsampling communication receiver according to the invention. The arrangement of FIG. 10 is similar to the arrangement of FIG. 3, except each of the stages of FIG. 3 is replaced by a plurality of such stages. For example, for N=8 in FIG. 10, banks B1, B2, . . . BN-1, BN indicate that each of the 8 stages of FIG. 3 is replaced by a corresponding bank, wherein each bank includes a plurality of stages. Each of the banks receives the current waveform at 21 from the LNTA 22, just as each stage of FIG. 3 does, and each of the banks also receives control bus inputs from a DCU. Each bank also drives the IF amplifier 25, as does each stage of FIG. 3.

Figure 11:
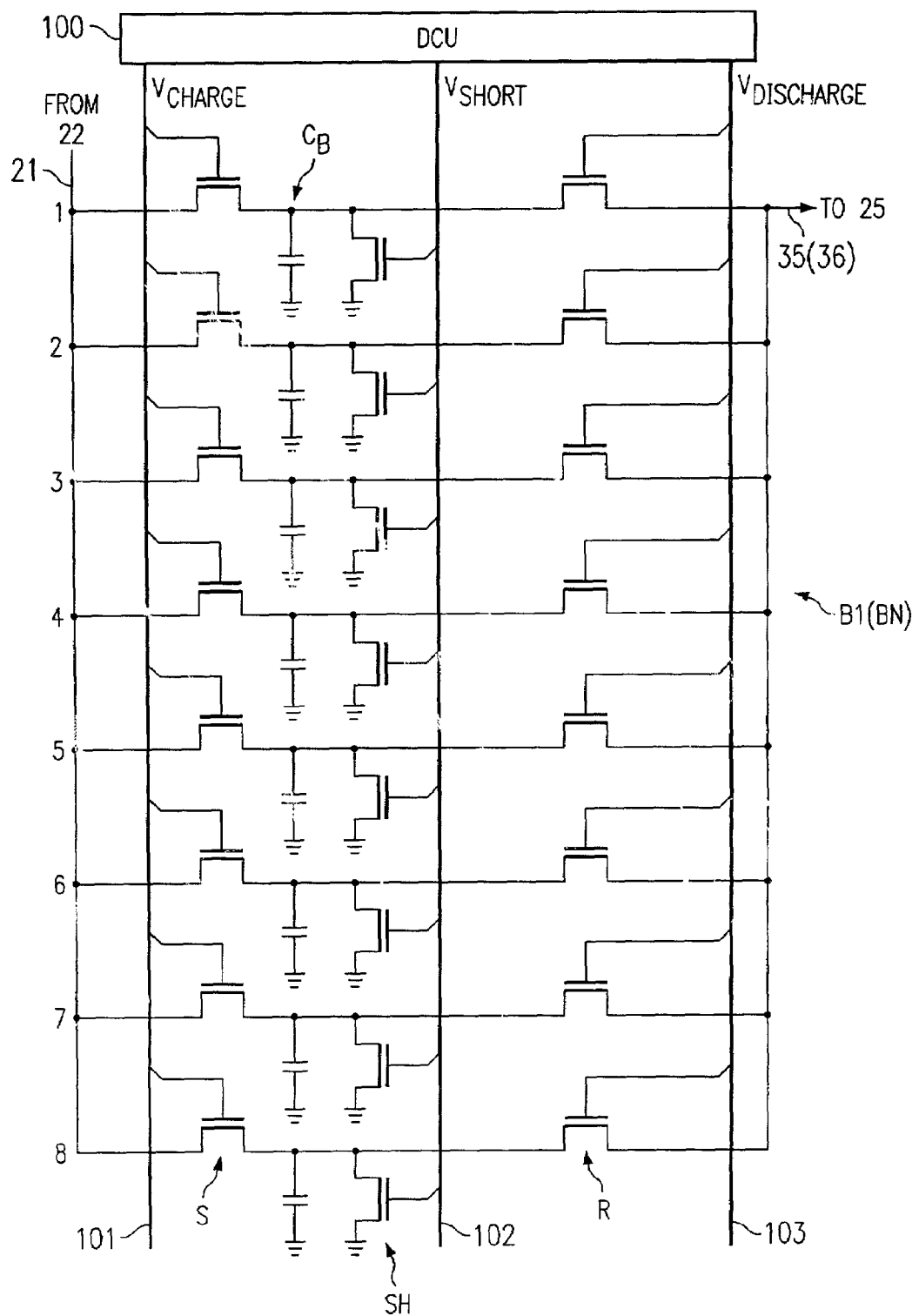
FIG. 11 diagrammatically illustrates exemplary embodiments of the capacitor banks of FIG. 10.

FIG. 11 diagrammatically illustrates exemplary embodiments of a bank of stages from FIG. 10. The example of FIG. 11 could correspond to any of the banks in FIG. 10. The exemplary bank of FIG. 11 includes 8 stages generally similar to the 8 stages of FIG. 3, each stage including a capacitor C, a sampling switch S, a shorting switch SH, and a read switch R. The sampling switches S are controlled by a DCU bus 101, the shorting switches SH are controlled by a DCU bus 102, and the read switches R are controlled by a DCU bus 103. Each stage of the bank of FIG. 11 includes a capacitor $C_B$. The value of the capacitor $C_B$ is determined from the total integrating capacitance value that is selected for the bank. For example, if an integrating capacitance value of K is desired, then the capacitance of $C_B$ would be K/(number of stages in the bank), for example K/8 in FIG. 11. In this manner, if all of the sampling switches S are closed by DCU 100 during a desired sampling interval, then the desired integrating capacitance K is presented to the current waveform at 21. However, by selectively activating the read switches R, coefficient values of 1, N-1/N, . . . 2/N and 1/N can be realized. That is, in the example of FIG. 11, coefficients of 1, ⅞, ¾, ⅝, ½, ⅜, ¼, and ⅛ can be realized. After the desired coefficient has been read out to the IF amplifier, all remaining charges in the capacitors of the bank can be removed by activation of the shorting switches SH. The example of FIG. 11 can represent any of the banks B1, B2, etc. connected to the non-inverting input 35 of the IF amplifier 25 of FIG. 10, and can also represent any of the banks BN, BN-1, etc. connected to the inverting input 36 of the IF amplifier 25 of FIG. 10. In some embodiments, different banks of FIG. 10 may have different numbers of stages. This advantageously permits various levels of coefficient resolution.

FIG. 12 illustrates in tabular format exemplary operations which can be performed by the DCU of FIG. 10, in conjunction with 8 bank structures B1–B8 such as shown in FIG. 11, to realize the following FIR filter function:

$$\tfrac{1}{4}[x(n)]+\tfrac{1}{8}[x(n-1)].$$

The leftmost column of FIG. 12 indicates which sample operation is being performed, in generally the same manner as in FIGS. 5, 6 and 8 above, and the remaining four columns indicate which of 8 exemplary banks (B1–B8) has switches S1–S8 closed, which has switches R1 and R2 closed, which has switch R3 closed, and which has switches SH1–SH8 closed. For each bank, the desired capacitance is used for integration by closing all eight sampling switches S1–S8 during the sampling operation, the coefficient ¼ is produced by thereafter closing read switches R1 and R2, and the coefficient ⅛ is produced by thereafter closing read switch R3. Using bank B1 as an example, after the read switch R3 has been closed to produce the coefficient ⅛ (during sample SA3), bank B1's shorting switches SH1–SH8 are closed (during SA4) to remove all charges from the capacitors of bank B1. Note, for example, that during sample SA3, the capacitors of bank B2 are integrating the sample SA3, while read switches R1 and R2 of bank B5 are closed to produce the coefficient ¼ for sample SA2, and read switch R3 of bank B1 is closed to produce the coefficient ⅛ for sample SA1.

FIG. 13 diagrammatically illustrates further exemplary embodiments of the banks of FIG. 10. The bank of FIG. 13 includes three capacitors, two of which have a capacitance value equal to K/4, where K is the desired integrating capacitance, and one of which has a capacitance value of K/2. The DCU 131 of FIG. 13 appropriately controls the sampling switch S, shorting switch SH and the further transistor switches 132–135 such that the current waveform 21 sees the desired capacitance K (by closing switches 132–135 with switch SH open). For read out, the DCU 131 controls the read switch R and the switches 132–135 as desired to produce a coefficient value of 1 (switches 132–135 all closed), a coefficient value of 0.75 (switches 132 and 134 closed, switches 133 and 135 open), or a coefficient value of 0.5 (switches 132–135 all open). After a desired coefficient has been realized using the bank of FIG. 13, any unwanted charge can be removed by closing switches 132–135 along with shorting switch SH.

FIGS. 15A–15B illustrate in tabular format exemplary operations which can be performed by stages 1–4 of FIG. 3 in response to DCU 34. As shown in FIGS. 15A–15B, beginning at sample SA19, read switch R1 is closed in order to read out the integrated samples stored in the capacitor of stage 1. This read operation of switch R1 continues through sample SA35 and, beginning with sample SA37, the samples integrated and stored by stage 2 are read out by closure of read switch R2. The samples integrated and stored by stages 3 and 4 are thereafter consecutively read out, after which the readout process returns to stage 1 and progresses through stages 1–4 repeatedly. Thus, in the example of FIGS. 15A–15B, after sample SA17, the integrated samples stored in stages 1–4 are continuously being read out to the IF amplifier 25 (see also FIG. 3). It should be clear that stages 5–8 can be operated analogously (not shown in FIGS. 15A–15B) with respect to the even numbered samples SA2, SA4, etc. Under these conditions, there is no opportunity to reset the IF amplifier 25 of FIG. 3, for example, by operating switches 38 and 39 appropriately to short their associated capacitors.

FIG. 16 diagrammatically illustrates further exemplary embodiments of the invention which permit resetting the IF amplifier. FIG. 16 illustrates additional stages such as shown in FIG. 3, which can be added to the arrangement of FIG. 3. Stage 9 as illustrated in FIG. 16 includes a sampling switch S, capacitor C, shorting switch SH and read switch R, just as do the other stages of FIG. 3. Stage 9, as illustrated, is intended to be cooperable with stages 1–4, and stage 10, as illustrated parenthetically in FIG. 16, is intended to be cooperable with stages 5–8. The cooperation of stage 9 with stages 1–4 permits resetting of the IF amplifier 25. One example of such cooperation between stages 1–4 of FIG. 3 and stage 9 of FIG. 16 is illustrated in FIGS. 17A–17B.

From sample SA1 through sample SA71 in FIG. 17A, the sampling switch operation of FIG. 17A is identical to that of FIG. 15A. However, FIG. 17A differs from FIG. 15A beginning at sample SA55, because switch R3 is not closed during samples SA55 through SA71, in contrast to FIG. 15A. Thus, stage 3 is not read out to the IF amplifier during this period of time, thereby permitting operation of switch 38 to reset the IF amplifier. Stages 5–8 can be operated analogously relative to even numbered samples in generally the same time period to permit operation of switch 39 to reset IF amplifier 25. This creates a period of time during which the IF amplifier can be read and reset. Beginning with sample SA73 and continuing through sample SA121, the sampling switch S9 of stage 9 replaces the sampling switch S3 of stage 3 in the sampling operation. Because the sampling switch S3 of stage 3 is not closed during this period of time, both read switches R3 and R4 of stages 3 and 4 can be closed from SA73 through SA89, instead of only read switch R4 as in FIG. 15A. Beginning with sample SA91 and continuing through sample SA125, the read switch operation of FIG. 17B is the same as the read switch operation of FIG. 15B. From sample SA127 through sample SA167, the sampling switch operation of FIG. 17B is the same as shown as in FIG. 15B. However, beginning with sample SA127 and continuing through sample SA143, no read switch is closed, thereby permitting the IF amplifier to be read and reset. Beginning at sample SA145 and continuing through sample SA161, both read switch R4 and read switch R9 are closed, instead of only read switch R4 as in FIG. 15B. Thereafter, beginning at sample SA163, read switch R1 is closed, as in FIG. 15B. Beginning at sample SA163, the read switch operation pattern illustrated at SA19 through SA161 repeats itself, and sample switch S9 is again substituted for sample switch S3 in generally the same manner described above. Stages 5–8 can be operated analogously in conjunction with stage 10 to process the even numbered samples.

Thus, by adding stage 9 for cooperation with stages 1–4 and stage 10 for cooperation with stages 5–8, additional samples can be integrated and stored while no read switch is closed, thereby permitting the IF amplifier to be reset.

FIG. 18 illustrates exemplary operations which can be performed by the embodiment of FIG. 3 to permit resetting of the IF amplifier. In the example of FIG. 18, stage 1 integrates and stores the first 9 odd numbered (i.e. positive half cycle) samples, stage 2 integrates and stores the next 9 samples, stage 3 integrates and stores the next 9 samples, and stage 4 integrates and stores the next 9 samples. This pattern of each stage integrating and storing 9 successive positive half cycle samples is repeated throughout the example of FIG. 18. However, in this example, no read switches are closed while sampling switch S4 is closed. After all 4 stages have integrated and stored samples, namely beginning with sample SA73, read switches R2, R3 and R4 are closed along with sampling switch S1, read switches R1, R3 and R4 are closed along with sampling switch S2, and read switches R1, R2 and R4 and closed along with sampling switch S3. Thus, the operation illustrated at sample SA73 through SA143 repeats itself beginning at sample SA145. Stages 5–8 of FIG. 3 can be operated analogously with respect to the even numbered (negative half cycle) samples. Because no read switches are closed along with sampling switch S4 (and analogously S8), the IF amplifier can be read and reset while stages 4 and 8 are sampling and integrating their allocated number of samples (9 each in this example).

Figure 19:
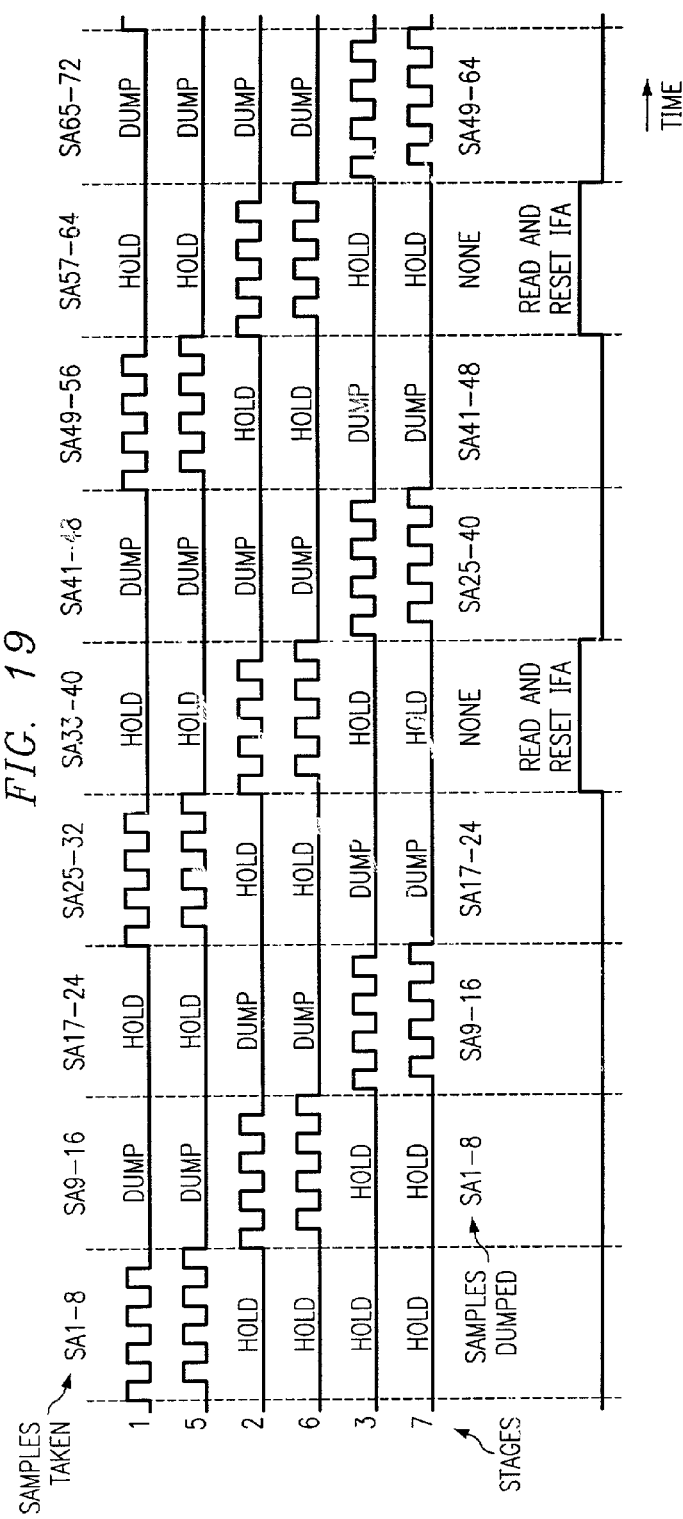
FIG. 19 is a timing diagram which illustrates exemplary operations which can be performed by the embodiments of FIG. 3.

FIG. 19 is a timing diagram which illustrates exemplary operations which can be performed by stages 1–3 and 5–7 of the arrangement of FIG. 3. The square wave pulses illustrated in FIG. 19 are the digital control pulses applied by the DCU to the gates of the sampling switches S of the stages illustrated in FIG. 19. Thus, for example, stages 1 and 5 are used to integrate samples SA1–SA8, stages 2 and 6 are used to integrate samples SA9–SA16, and stages 3 and 7 are used to integrate samples SA17–SA24. Stages 1 and 5 are then used again to integrate samples SA25–SA32, and so on as illustrated.

Also in FIG. 19, the term "hold" designates those periods of time wherein both the sampling switch S and the read switch R of a given stage are both open. Also, the term "dump" in FIG. 19 designates those periods of time wherein the sampling switch S of a given stage is open while the read switch R of that stage is closed, thereby permitting the charge stored in the capacitor C of that stage to be "dumped" to the IF amplifier 25. Thus, as shown in FIG. 19, samples SA1–SA8 are dumped from stages 1 and 5 while samples SA9–SA16 are integrated by stages 2 and 6, samples SA9–SA16 are dumped from stages 2 and 6 while samples SA17–SA24 are integrated by stages 3 and 7, and samples SA17–SA24 are dumped from stages 3 and 7 while samples SA25–SA32 are integrated by stages 1 and 5.

Thereafter, while stages 2 and 6 integrate samples SA33–SA40, all of stages 1, 3, 5 and 7 are held instead of dumped. Then, while stages 3 and 7 integrate samples SA41–SA48, samples SA25–SA32 (previously integrated by stages 1 and 5) are dumped by stages 1 and 5, and samples SA33–SA40 (previously integrated by stages 2 and 6) are dumped from stages 2 and 6. During the integration of samples SA33–SA40, while samples SA25–SA32 are still being held in stages 1 and 5, the IF amplifier 25 can be read and reset as illustrated in FIG. 19. Thereafter, while stages 3 and 7 integrate samples SA41–SA48, stages 1 and 5 "catch up" by dumping samples SA25–SA32 simultaneously with the dumping of samples SA33–SA40 from stages 2 and 6. Thereafter, samples SA49–SA56 are integrated by stages 1 and 5 while stages 3 and 7 dump samples SA41–SA48, after which samples SA49–SA56 are held in stages 1 and 5 while stages 2 and 6 integrate samples SA57–SA64. This permits the IF amplifier to be read and reset while stages 2 and 6 integrate samples SA57–SA64. Stages 1 and 5 "catch up" while stages 3 and 7 integrate samples SA65–SA72. This "catch up" is again accomplished by dumping stages 1 and 5 (samples SA49–SA56) simultaneously with stages 2 and 6 (samples SA57–SA64).

As illustrated by the exemplary embodiments of FIGS. 15–19, various numbers of stages can be utilized and controlled appropriately to permit the IF amplifier to be read and reset with any desired frequency.

Referring again to FIG. 7, the signal y(n) can be expressed as follows:

$$y(n) = \sum_{i=0}^{M-1} cf(i) \cdot x(n-i).$$

In the frequency domain, this becomes:

$$Y(z) = C(z)X(z).$$

Note that C(z) can be also be expressed as follows:

$$C(z) = C(z)[(1-z^{-1})/(1-z^{-1})] = C^{diff}(z)/(1-z^{-1}), \text{ where}$$

$$C^{diff}(z) = C(z) - z^{-1}C(z).$$

$C^{diff}$ can be considered to be a filter whose output is given by:

$$Y^{diff}(z) = C^{diff}(z)X(z).$$

Note that, in $C^{diff}$, the term $z^{-1} C(z)$ is merely a delayed response of the filter C(z), so $C^{diff}$ is realized by using a filter whose coefficients are obtained by subtracting cf(i−1) from cf(i). Such coefficients are conventionally referred to as differential coefficients, and the use of filters with such differential coefficients is well known in the art. For a filter having coefficients that are highly correlated, the dynamic range requirement of the filter can be reduced by using the $C^{diff}$ filter with the differential coefficients. The digital time domain function $y^{diff}(n)$ corresponding to $Y^{diff}(z)$ is expressed as follows:

$$y^{diff}(n) = cf(0)x(n) + \sum_{i=1}^{M-1} (cf(i) - cf(i-1))x(n-i) - cf(M-1)x(n-M+1).$$

The dynamic range requirement of a filter utilizing differential coefficients is typically only a small fraction of the dynamic range requirement of the original filter.

Figure 20:
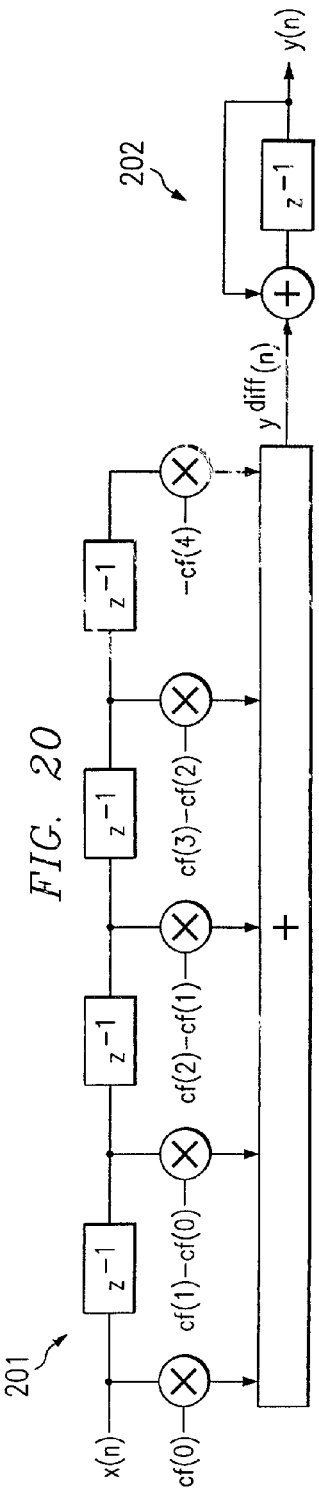
FIG. 20 diagrammatically illustrates a differential filter which can be implemented by the embodiments of FIGS. 2–13.

FIG. 20 diagrammatically illustrates an exemplary embodiment of a differential filter which can be realized by the embodiments of FIGS. 2–13. The structure of the differential filter 201 of FIG. 20 is generally similar to that of the filter illustrated in FIG. 7 (for M=4), except the DCU controls the sampling switches S and read switches R such that the filter utilizes the illustrated differential coefficient values. The differential filter 201 produces the signal $y^{diff}(n)$, which is then applied, in the embodiment of FIG. 20, to an integrating filter 202 which produces the desired signal y(n). The integrating filter 202 accounts for the fact that $C^{diff}(z)$ must be divided by $(1-z^{-1})$ to obtain the desired transfer function C(z). In some exemplary embodiments, the integrating filter illustrated at 202 can be replaced by another recursive filter. In other exemplary embodiments, the filter at 202 can be completely eliminated, and unwanted interferer energy will still be substantially rejected.

FIGS. 21 and 22 diagrammatically illustrate exemplary positioning of a recursive filter (for example the integrator of FIG. 20 or a lossy integrator) according to the invention. As shown in FIG. 21, the recursive filter can be implemented within the analog signal processing section 26 of FIG. 2 and, as shown in FIG. 22, the recursive filter can be implemented digitally at the digital output side of the A/D converter 27 of FIG. 2. FIGS. 21 and 22 also illustrate further exemplary embodiments wherein the output of the recursive filter can be applied to a low pass (LP) filter to obtain additional filtering functions. In other embodiments, the low pass filter can be omitted, as shown by a broken line in FIGS. 21 and 22.

The dynamic range of differential coefficients is reduced when using the sliding window integration technique described above relative to FIG. 8A. This means that a smaller capacitor spread can be used to realize a filter that would otherwise require a much larger capacitor spread. For example, the original filter may require realizing a capacitor spread of 1 pF–256 pF, which is very difficult due to large dynamic range. For a narrowband filter, using differential coefficients can advantageously reduce this dynamic range to a much smaller range of variation.

Figure 23:
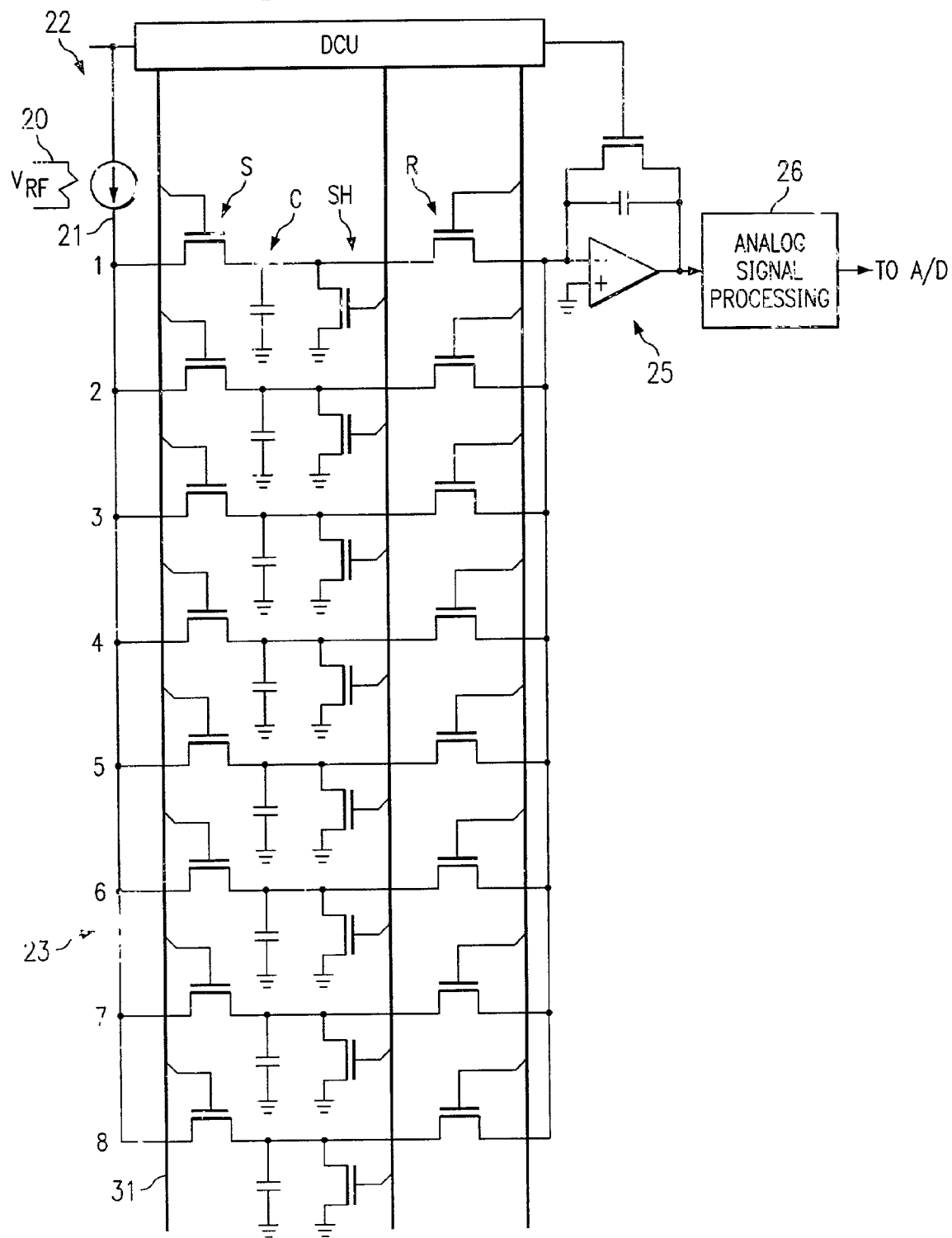
FIG. 23 diagrammatically illustrates further exemplary embodiments of portions of the architecture of FIG. 2.

FIG. 23 diagrammatically illustrates exemplary embodiments of portions of the multi-tap digital subsampling receiver architecture of FIG. 2. FIG. 23 presents a single-ended example including stages 1–8 as shown in FIG. 3, but wherein the outputs of all read switches R are connected together at the inverting input of the IF amplifier, whose non-inverting input is connected to a fixed potential (e.g. ground) to provide the single-ended configuration.

Figure 25:
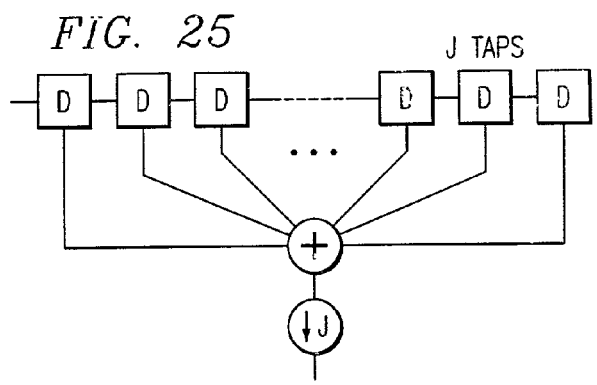
FIG. 25 diagrammatically illustrates an equivalent filter produced by the operations of FIG. 24.

If, for example, stages 1 and 2 are operated to integrate alternate samples in a sequence of J samples, such as shown in the first two rows of the table in FIG. 24 (see also FIG. 4), and if the charges stored in stages 1 and 2 are thereafter read out to the IF amplifier 25, as shown (by closure of read switches R1 and R2) in the third and fourth rows of the table of FIG. 24, then the equivalent filter is illustrated in FIG. 25. That is, J consecutive samples, namely SA1–SAJ, are integrated and stored in stages 1 and 2, in response to control signals produced by the DCU on the sampling switch control bus 31. This operation of the sampling switch control bus 31 results in the computation of an inner produce with the sequence $\{1, 1 \ldots 1\}$. Thus, any sampling switch control sequence applied, for example, to sampling switches S1 and S2 is correlated with the input signal, and the result is stored in the corresponding capacitors of stages 1 and 2. Therefore, despreading of CDMA signals can be obtained by applying the spreading sequence or pseudo-noise (PN) code at sampling switches S1 and S2. The capacitors of stages 1 and 2 then act as a correlator. The output of the correlator can then be moved to the IF amplifier 25. The DCU can provide the spreading sequence or the PN code at the control inputs of the sampling switches S1 and S2.

As shown in FIG. 24, after samples SA1–SAJ have been integrated by stages 1 and 2, samples SAJ+1–SA2J are sampled and integrated by stages 3 and 4 while the integrated samples from stages 1 and 2 are read out to the IF amplifier. Thereafter, the samples SA2J+1–SA3J are integrated and stored by stages 1 and 2, while samples SAJ+1–SA2J stored in stages 3 and 4 are read out to the IF amplifier. Samples SA3J+1–SA4J (not explicitly shown) are handled by stages 3 and 4, as stages 1 and 2 continue to alternate with stages 3 and 4, stages 1 and 2 integrating while stages 3 and 4 are reading out, and vice versa.

If the LNTA 22 is designed to provide two independent (e.g. current mirrored) outputs (not explicitly shown in FIG. 23), with one output connected to stages 1–4 and the other output connected to stages 5–8, then the structure of FIG. 23 can parallelize the despreading operation, because a different spreading sequence or PN code can be used with respect to stages 5–8 than is used with respect to stages 1–4. This can be viewed as a RAKE operation with stages 1–4 used as a first RAKE finger and stages 5–8 used as a second RAKE finger. The capacitors C associated with each RAKE finger contain the correlator output values. Thus, stages 5, 6, 7 and 8 process the same samples as stages 1, 2, 3 and 4, respectively, but with a different spreading sequence or PN code.

Continuing with the example of FIGS. 23–25, any additional number of RAKE fingers can be provided by simply adding 4 additional stages for each additional RAKE finger. Moreover, additional stages can also be added for the purpose of relaxing the readout and reset timing of the IF amplifier 25, in generally the same fashion as described above with respect to FIGS. 15–19.

FIG. 14 illustrates exemplary operations which can be performed by exemplary embodiments of the present invention. At 141, the voltage waveform is transformed into a current waveform. At 142, capacitors are used to integrate samples of the current waveform. At 143, analog signal processing (for example to produce FIR filtering) is performed on the integrated samples.

Figure 26:
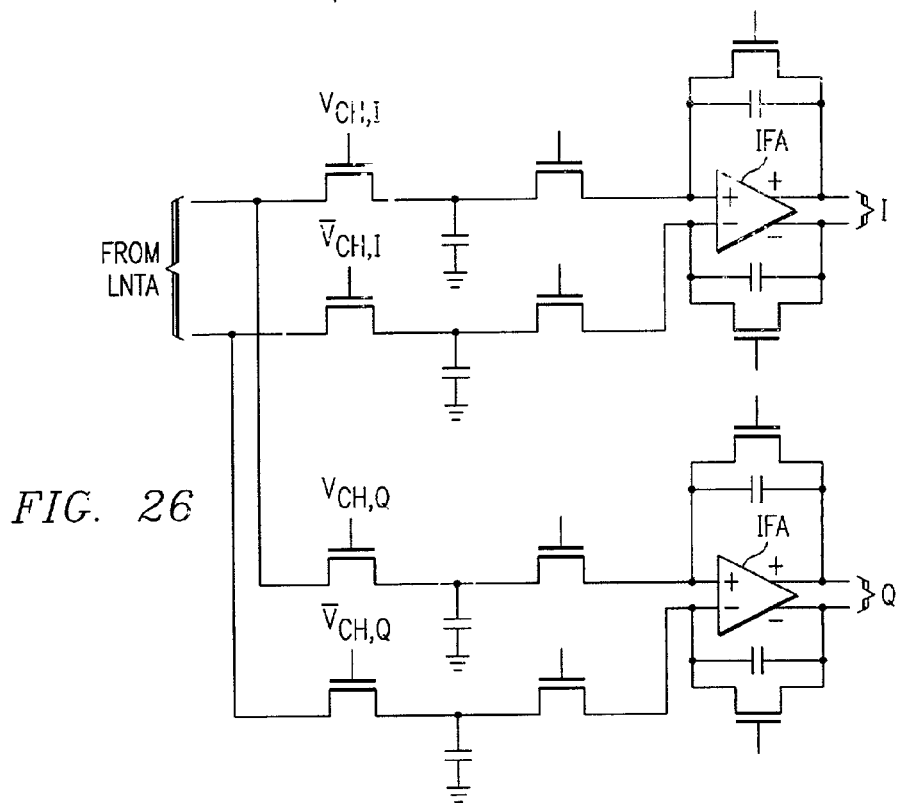
FIG. 26 diagrammatically illustrates exemplary embodiments of the invention that can perform I/Q mixing.
Figure 27:
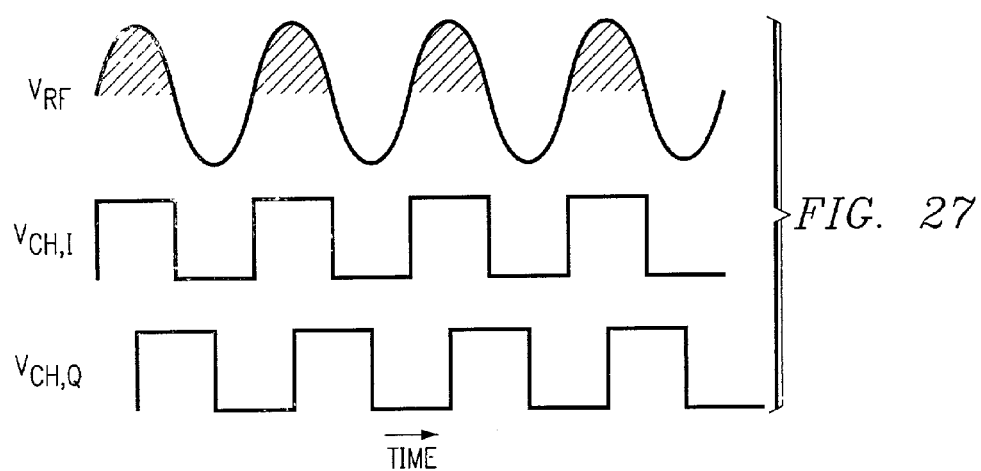
FIG. 27 graphically illustrates exemplary control signals which can be used in the embodiments of FIG. 26.

FIG. 26 diagrammatically illustrates exemplary embodiments of the invention that can perform I/Q mixing. Two separate (e.g. current mirrored) LNTA outputs are provided. Each LNTA output drives two sampling capacitors, one associated with an input (non-inverting or inverting) of the I phase differential amplifier, and one associated with the corresponding input (non-inverting or inverting) of the Q phase differential amplifier. Examples of the signals ($V_{Ch,I}$ and $\overline{V}_{Ch,I}$ and $\overline{V}_{CH,Q}$ and $V_{Ch,Q}$) that control the sampling capacitors of FIG. 26 are shown graphically in FIG. 27. As shown in FIG. 27, the I phase control signal $V_{Ch,I}$ is in phase with the $V_{RF}$ waveform $V_{RF}$, and the Q phase control signal $V_{Ch,Q}$ is phase shifted by 90°.

Note that any suitable charge transfer technology can be used to support the exemplary filtering operations described herein. In the exemplary embodiments described above, voltage is converted to current, which is integrated on sampling capacitors, and the resulting charge is manipulated to perform filtering. However, any technology which permits sampling the area under the RF carrier half periods and then manipulating these samples can be used.

It will be apparent to workers in the art that the digitally controlled filtering technique described above can reduce the dynamic range requirements of subsequent stages in the analog front end. By appropriate control of the DCU bus lines, an arbitrary decimating FIR filter function can be realized. Multi-bit coefficient resolution can be obtained in a direct sampling mixer. The invention provides digital controls for an FIR filter, which can be used to provide a programmable transfer function through a DSP core or other microcontroller/microprocessor. The FIR filter permits rejection of unwanted energy, thereby reducing the dynamic range of subsequent components in the signal path. This has the potential of reducing the power dissipation while providing programmability of the signal path immediately after the LNTA. The invention can be used, for example, to provide a highly integrated RF front end design in deep submicron CMOS technology at a relatively low cost. The invention is also readily applicable to technologies other than CMOS. The disclosed sampling in the current domain provides a high degree of tolerance of timing jitter in the sampling clock. The invention also provides high linearity in a subsampling receiver architecture because the filter transfer function(s) can be designed to ensure that the sampling switches can be operated in their linear region of operation during the sampling process.

The invention provides further exemplary advantages, such as the ability to combine charges from different samples to obtain filtering, the ability to mix an RF signal to IF by controlling the amount of time that the RF waveform is integrated on the sampling capacitor, the ability to mix by commutation (that is, inverting the odd samples and combining them with even samples). Other exemplary advantages include a simple design and robustness.

Although exemplary embodiments of the invention are described above in detail, this does not limit the scope of the invention, which can be practiced in a variety of embodiments.

What is claimed is:

1. A method of downconverting a first periodic voltage waveform into a second periodic voltage waveform, comprising:

obtaining from the first voltage waveform a plurality of temporally distinct samples respectively indicative of areas under corresponding half-cycles of the first voltage waveform and transforming the first voltage waveform into a corresponding current waveform, and integrating each half-cycle of the current waveform wherein said integrating step includes using each half-cycle of the current waveform to charge a corresponding capacitor;

combining the samples to produce the second voltage waveform; and manipulating the samples to implement a filtering operation such that the second voltage waveform represents a downconverted, filtered version of the first voltage waveform.

2. The method of claim 1, wherein said manipulating step includes, in said using step, using one of the half-cycles to charge a plurality of capacitors.

3. The method of claim 2, wherein said manipulating step includes, in said combining step, dumping charge from different ones of said plurality of capacitors during respectively different periods of time.

4. The method of claim 3, wherein said dumping step includes sharing the dumped charge with charge on a further capacitor.

5. The method of claim 1, wherein said manipulating step includes, in said combining step, simultaneously dumping charge from a plurality of capacitors that have been charged by respective half-cycles of the current waveform.

6. The method of claim 5, wherein said dumping step includes sharing the dumped charge with charge on a further capacitor.

7. The method of claim 1, wherein said manipulating step includes, in said using step, using a plurality of the half-cycles to charge a single capacitor.

8. The method of claim 7, wherein said last-mentioned using step includes using respective pluralities of the half-cycles to charge respective capacitors.

9. The method of claim 8, wherein said manipulating step includes, in said combining step, simultaneously dumping charge from the respective capacitors.

10. The method of claim 9, wherein said dumping step includes sharing the dumped charge with charge on a further capacitor.

11. The method of claim 8, wherein said manipulating step includes, in said combining step, dumping charge from the respective capacitors during respectively different time periods that timewise overlap one another.

12. The method of claim 11, wherein said dumping step includes sharing the dumped charge with charge on a further capacitor.

13. The method of claim 1, wherein said filtering operation includes one of FIR and IIR filtering.

14. The method of claim 1, wherein said filtering operation includes one of fractional coefficient filtering and differential coefficient filtering.

15. The method of claim 1, wherein said filtering operation includes triangular coefficient filtering.

16. The method of claim 1, wherein the first voltage waveform is an RF waveform.

17. An apparatus for downconverting a first periodic voltage waveform into a second periodic voltage waveform, comprising:

an input for receiving the first voltage waveform;

a sampler coupled to said input for obtaining from the first voltage waveform a plurality of temporally distinct samples respectively indicative of areas under corresponding half-cycles of the first voltage waveform, said sampler including a transconductance amplifier for transforming the first voltage waveform into a corresponding current waveform, and a plurality of capacitors coupled to said transconductance amplifier for integrating each half-cycle of the current waveform;

a combiner coupled to said sampler for combining the samples to produce the second voltage waveform; and at least one of said sampler and said combiner operable for manipulating the samples to implement a filtering operation such that the second voltage waveform represents a downconverted, filtered version of the first voltage waveform.

18. The apparatus of claim 17, wherein said sampler is operable for using each half-cycle of the current waveform to charge a corresponding one of said capacitors.

19. The apparatus of claim 18, wherein said sampler is operable for using one of the half-cycles to charge a group of said capacitors.

20. The apparatus of claim 19, wherein said combiner is operable for dumping charge from different ones of said group of capacitors during respectively different periods of time.

21. The apparatus of claim 20, wherein said combiner includes a further capacitor coupled to said group of capacitors, said combiner operable for sharing charge dumped from said group of capacitors with charge on said further capacitor.

22. The apparatus of claim 18, wherein said combiner is operable for simultaneously dumping charge from a group of said capacitors that have been charged by respective half-cycles of the current waveform.

23. The apparatus of claim 22, wherein said combiner includes a further capacitor coupled to said group of capacitors, said combiner operable for sharing the charge dumped from said group of capacitors with charge on said further capacitor.

24. The apparatus of claim 18, wherein said sampler is operable for using a plurality of the half-cycles to charge one of said capacitors.

25. The apparatus of claim 24, wherein said sampler is operable for using respective pluralities of the half-cycles to charge respective ones of a group of said capacitors.

26. The apparatus of claim 25, wherein said combiner is operable for simultaneously dumping charge from said group of capacitors.

27. The apparatus of claim 26, wherein said combiner includes a further capacitor coupled to said group of capacitors, said combiner operable for sharing the charge dumped from said group of capacitors with charge on said further capacitor.

28. The apparatus of claim 25, wherein said combiner is operable for dumping charge from said respective ones of said group of capacitors during respectively different time periods that timewise overlap one another.

29. The apparatus of claim 28, wherein said combiner includes a further capacitor coupled to said group of capacitors, said combiner operable for sharing charge dumped from said group of capacitors with charge on said further capacitor.

30. The apparatus of claim 17, including an output coupled to said combiner for providing the second voltage waveform to a driver stage, said combiner including a plurality of switches connected between said capacitors and said output for selectively connecting said capacitors to said output.

31. The apparatus of claim 30, wherein said output includes first and second electrically distinct nodes, and said second voltage waveform is provided in differential format at said output.

32. A communication receiving apparatus, comprising:
an input for receiving a communication signal formed as a first periodic voltage waveform;
a mixer coupled to said input for downconverting the first periodic voltage waveform into a second periodic voltage waveform, including a sampler coupled to said input for obtaining from the first voltage waveform a plurality of temporally distinct samples respectively indicative of areas under corresponding half-cycles of the first voltage waveform, a combiner coupled to said sampler for combining the samples to produce the second voltage waveform, and at least one of said sampler and said combiner operable for manipulating the samples to implement a filtering operation such that the second voltage waveform represents a downconverted, filtered version of the first voltage waveform; and
a signal processing portion coupled to said mixer for receiving and processing the second voltage waveform.

33. The apparatus of claim 32, wherein said communication signal is an RF communication signal.

34. The apparatus of claim 32, wherein said filtering operation includes one of FIR and IIR filtering.

35. The apparatus of claim 32, wherein said filtering operation includes one of fractional coefficient filtering and differential coefficient filtering.

36. The apparatus of claim 32, wherein said filtering operation includes triangular coefficient filtering.

37. The method of claim 1, wherein said manipulating decimates the samples.

38. The apparatus of claim 17, wherein said manipulating decimates the samples.

* * * * *